(12) United States Patent
Nagamatsu et al.

(10) Patent No.: US 8,768,519 B2
(45) Date of Patent: Jul. 1, 2014

(54) APPARATUS AND METHOD FOR CONTROLLING GRILLE APERTURE RATIOS OF A PLURALITY OF AIR TRANSFER GRILLES

(75) Inventors: Ikuro Nagamatsu, Kawasaki (JP); Junichi Ishimine, Kawasaki (JP); Seiichi Saito, Kawasaki (JP); Masahiro Suzuki, Kawasaki (JP); Tadashi Katsui, Kawasaki (JP); Yuji Ohba, Kawasaki (JP); Nobuyoshi Yamaoka, Kawasaki (JP); Akira Ueda, Kawasaki (JP); Yasushi Uraki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 567 days.

(21) Appl. No.: 12/782,878

(22) Filed: May 19, 2010

(65) Prior Publication Data
US 2010/0298990 A1   Nov. 25, 2010

(30) Foreign Application Priority Data

May 21, 2009   (JP) ................................. 2009-123524

(51) Int. Cl.
*G05D 23/00*   (2006.01)
*H05K 7/20*   (2006.01)
(52) U.S. Cl.
CPC .................. *H05K 7/20836* (2013.01)
USPC ........ 700/276; 703/2; 703/5; 703/9; 454/225; 454/184; 454/264; 454/258; 361/696; 361/690; 361/688; 700/277; 700/300
(58) Field of Classification Search
CPC .......... H05K 7/20709; H05K 7/20836; H05K 7/20745; G06F 17/50; G06F 2217/16; G06F 17/5009
USPC .............................................. 700/276; 703/9
See application file for complete search history.

(56) References Cited

U.S. PATENT DOCUMENTS

| 6,694,759 B1 | 2/2004 | Bash et al. |
| 6,747,872 B1 * | 6/2004 | Patel et al. .................... 361/695 |

(Continued)

FOREIGN PATENT DOCUMENTS

| GB | 2 410 546 A | 8/2005 |
| JP | 5-36236 | 5/1993 |

(Continued)

OTHER PUBLICATIONS

Schmidth et al, "Measurements and Predictions of the Flow Distribution Through Perforated Tiles in Raised-Floor Data Centers", 2001, pp. 1-10.*

(Continued)

*Primary Examiner* — Ryan Jarrett
*Assistant Examiner* — Olvin Lopez Alvarez
(74) *Attorney, Agent, or Firm* — Squire Sanders (US) LLP

(57) ABSTRACT

An apparatus for controlling grille aperture ratios of a plurality of air transfer grilles which are installed in a room, includes a determining unit for determining target grille air volumes of air blowing to the racks, for determining simulation air volumes of air blowing from the air transfer grilles on the basis of the target grille air volumes so that each of air of the target grille air volumes are blown to the racks, and for determining grille aperture ratios for each of the air transfer grilles on the basis of the plurality of simulation air volumes so that each of the amounts of air blowing from the air transfer grilles is replaced by each of the simulation air volumes, and a controller for controlling each of the grille aperture ratios of the air transfer grilles on the basis of each of the determined grille aperture ratios.

15 Claims, 18 Drawing Sheets

(56) References Cited

U.S. PATENT DOCUMENTS

| | | | |
|---|---|---|---|
| 7,051,946 B2 * | 5/2006 | Bash et al. | 236/49.3 |
| 7,286,351 B2 * | 10/2007 | Campbell et al. | 361/696 |
| 7,558,649 B1 * | 7/2009 | Sharma et al. | 700/282 |
| 8,180,494 B2 * | 5/2012 | Dawson et al. | 700/278 |
| 8,180,495 B1 * | 5/2012 | Roy | 700/278 |
| 8,589,123 B2 * | 11/2013 | Uraki et al. | 703/1 |
| 2005/0023363 A1 * | 2/2005 | Sharma et al. | 236/49.3 |
| 2005/0155646 A1 * | 7/2005 | Bash et al. | 137/78.5 |
| 2006/0075764 A1 * | 4/2006 | Bash et al. | 62/178 |
| 2006/0080001 A1 * | 4/2006 | Bash et al. | 700/276 |
| 2006/0091229 A1 * | 5/2006 | Bash et al. | 236/49.3 |
| 2007/0038414 A1 * | 2/2007 | Rasmussen et al. | 703/1 |
| 2007/0078635 A1 * | 4/2007 | Rasmussen et al. | 703/1 |
| 2009/0138313 A1 * | 5/2009 | Morgan et al. | 705/8 |
| 2009/0164811 A1 | 6/2009 | Sharma et al. | |
| 2010/0029193 A1 | 2/2010 | Ahladas et al. | |
| 2011/0060571 A1 * | 3/2011 | Ueda et al. | 703/9 |
| 2011/0307820 A1 * | 12/2011 | Rasmussen et al. | 715/771 |
| 2012/0059628 A1 * | 3/2012 | VanGilder et al. | 703/1 |
| 2013/0273825 A1 * | 10/2013 | Uno et al. | 454/184 |

FOREIGN PATENT DOCUMENTS

| | | |
|---|---|---|
| JP | 07-091731 | 4/1995 |
| JP | 07-310943 | 11/1995 |
| JP | 2002-006992 | 1/2002 |
| JP | 2006-046671 | 2/2006 |
| JP | 2008-185271 | 8/2008 |

OTHER PUBLICATIONS

Karki et al, "Use of Computational Fluid Dynamics for Calculating Flow Rates Through Perforated Tiles in Raised-Floor Data Centers", Apr. 2003, International Journal of Heating, Ventilation, Air-Conditioning, and Refrigeration Research, vol. 9, No. 2, pp. 153-166.*

Schmidth et al, "Raised-Floor data Center: Perforated Tile Flow Rates fro VArious Tile Layouts", Jun. 2004, pp. 8.*

Vangilder et al, "Airflow uniformity Through perforated tiles in a Raised-floor Data center", Jul. 2005, pp. 11.*

United Kingdom application No. GB 1008255.0 dated Sep. 14, 2010.

* cited by examiner

FIG. 8
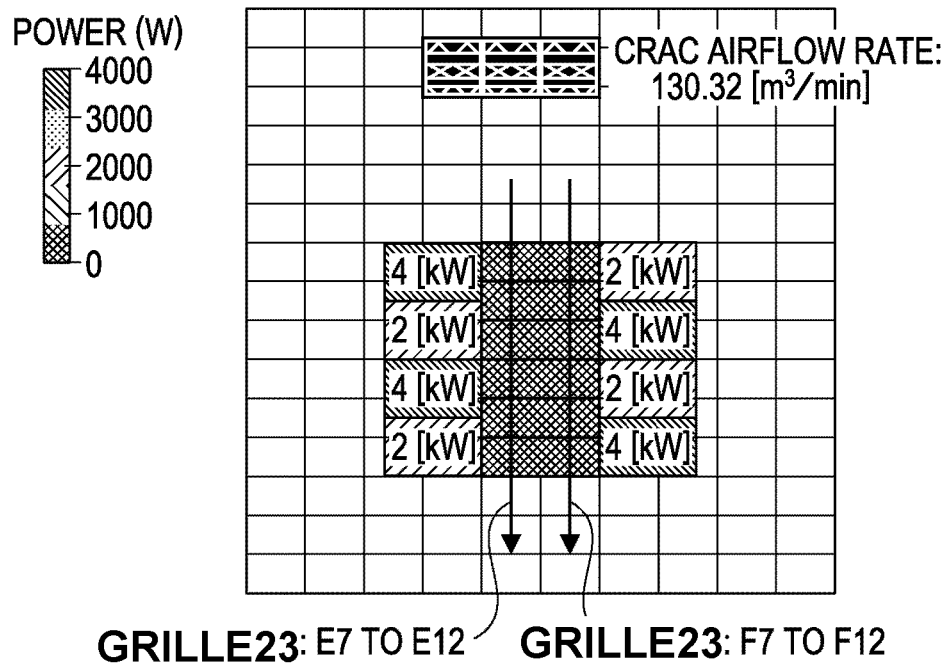
GRILLE23: E7 TO E12   GRILLE23: F7 TO F12
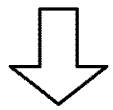
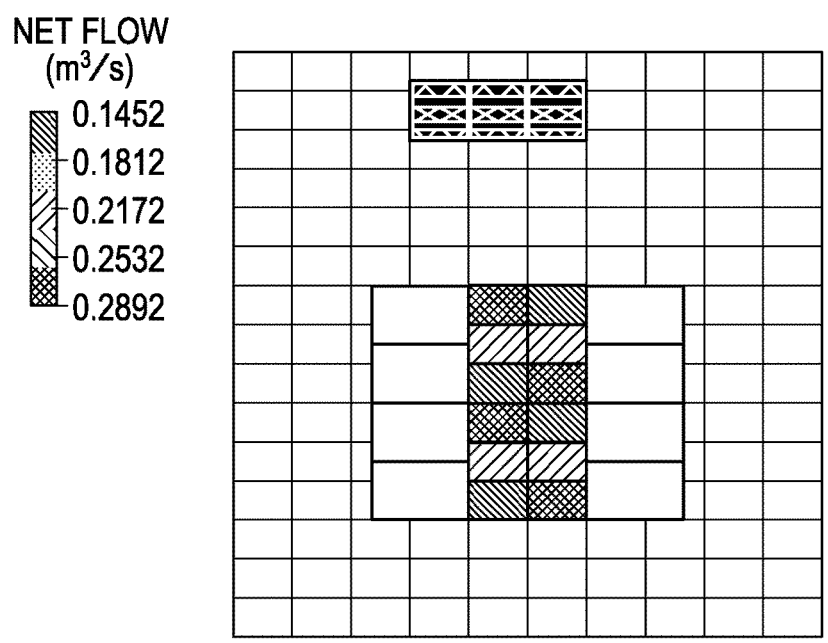

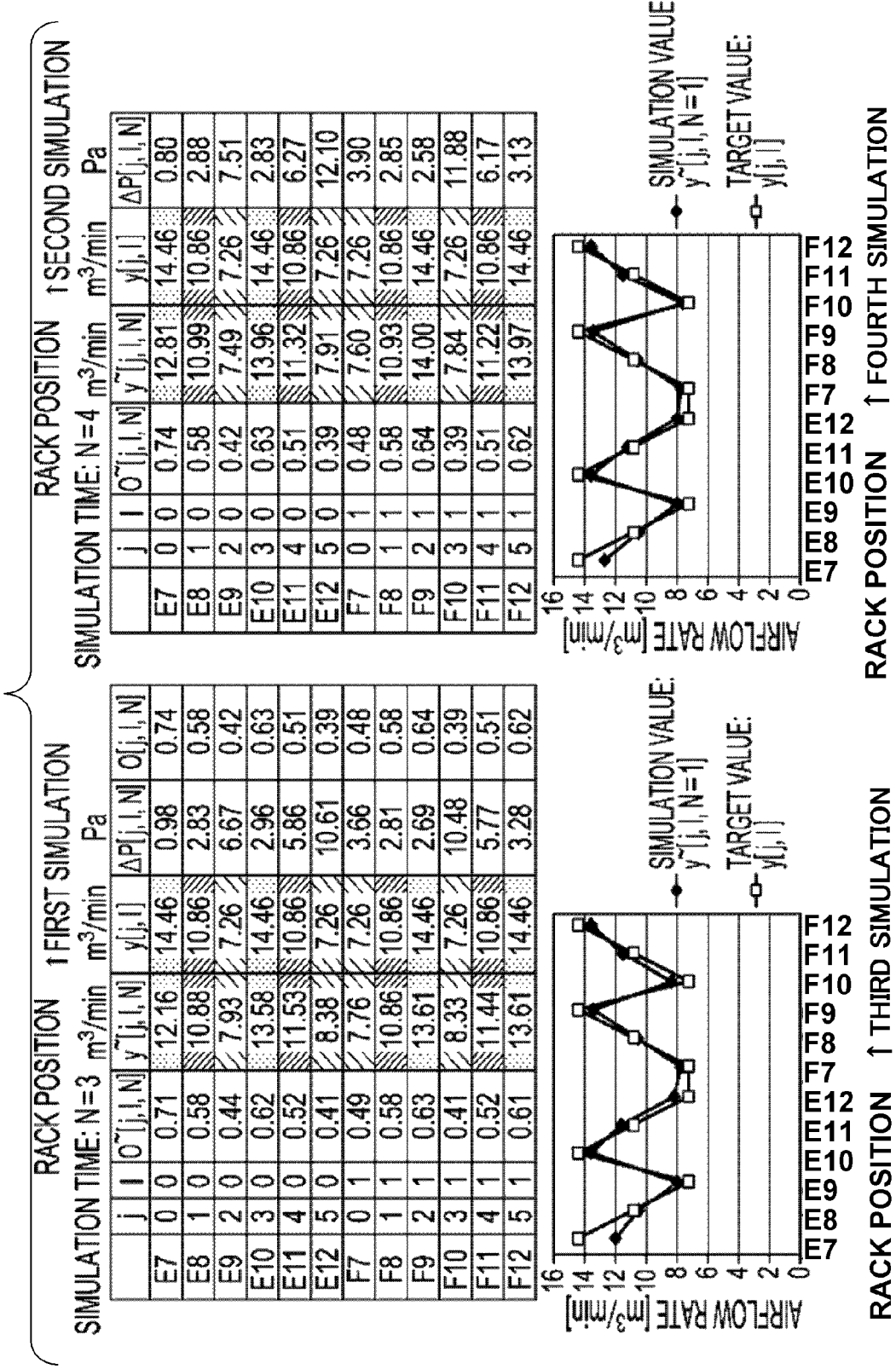

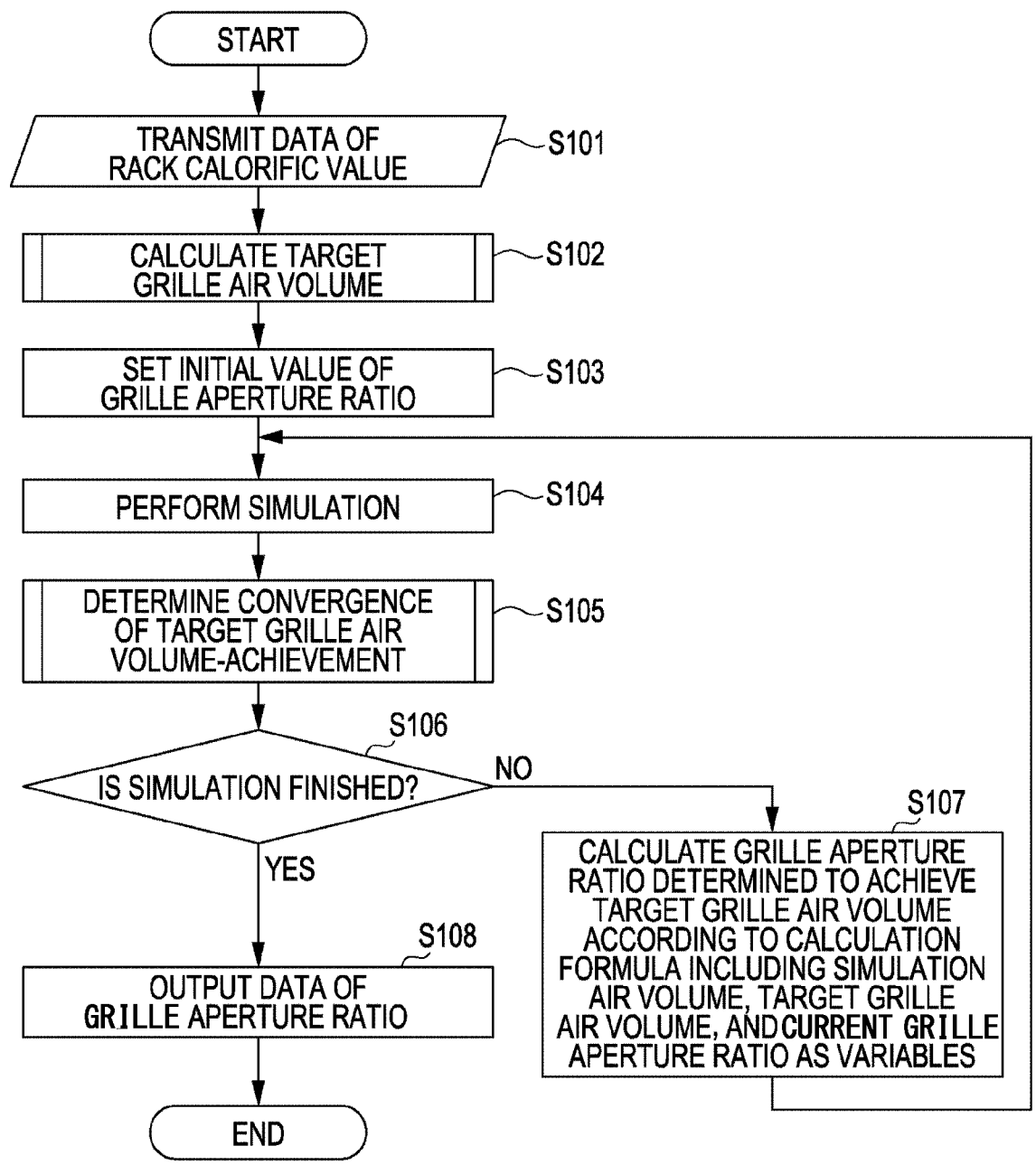

US 8,768,519 B2

APPARATUS AND METHOD FOR CONTROLLING GRILLE APERTURE RATIOS OF A PLURALITY OF AIR TRANSFER GRILLES

CROSS-REFERENCE TO RELATED APPLICATION

This application is based upon and claims the benefit of priority of the prior Japanese Patent Application No. 2009-123524, filed on May 21, 2009, the entire contents of which are incorporated herein by reference.

FIELD

The embodiments discussed herein are related to an apparatus and method for controlling grille aperture ratios of a plurality of air transfer grilles.

BACKGROUND

Data centers may be configured to supply cold air to server racks bearing information technology (IT) devices from the under floor space through air transfer grilles (grilles) have been used. In the above-described data center, there has been a tendency for the calorific value of each of the server racks to increase with an increase in the heat generation density of the IT devices borne on the server racks. Consequently, a hotspot or the like occurs due to the infiltration of exhaust from the IT devices.

Here, the air flows that are observed in the data center will be described with reference to FIG. 17. As shown in FIG. 17, the air flows that are observed in the data center include the flow of air that is blown out from an air conditioner and that is sucked into the rack (see I shown in FIG. 17), the flow of air that is blown out from the air conditioner and that is sucked into the air conditioner (see II shown in FIG. 17), the flow of air that is discharged from the rack and that is sucked into the air conditioner (see III shown in FIG. 17), and the flow of air that is discharged from the rack and that is sucked into the rack (see IV shown in FIG. 17).

When a large volume of air is exhausted from the rack and is passed to a path leading to the rack so that the air is sucked into the rack 21, the hotspot occurs due to the infiltration of exhaust from the IT devices. The method of reducing the temperature of air sent from an air conditioner and/or the method of adding facilities to the data center have been available as the method of reducing the above-described hotspot (see Japanese Laid-open Patent Publication No. 2008-185271, Japanese Laid-open Patent Publication No. 2006-046671, and Japanese Laid-open Patent Publication No. 2002-6992). For example, the method of adding an air conditioning system to reduce the temperature of air sent from an air conditioner to reduce the temperature of the entire room and/or the method of adding a partition to the side part of a row of racks and/or the upper part of the rack has been used to reduce the hotspot occurring due to the exhaust infiltration.

Incidentally, since the above-described method of reducing the temperature of the air sent from the air conditioner and/or the above-described method of adding the facility to the data center allows for reducing the air temperature, a large amount of power is consumed. Further, since providing the additional facilities costs money, it has been difficult to cool the racks with efficiency.

SUMMARY

According to an aspect of the embodiments, an apparatus for controlling grille aperture ratios of a plurality of air transfer grilles which are installed in a room, each of the air transfer grilles blowing air cooled by an air conditioner, the room accommodating a plurality of computers, each of the computers having an inlet and controlling the amount of intake air on the basis of an internal temperature of each of the computers, the apparatus includes, a memory for storing first information including a plurality of relations, each of the relations being relation between one of the air transfer grilles and at least one of the computers inhaling air from the one grille;

an obtaining unit for obtaining second information corresponding to an amount of intake air of each of the computers, a determining unit for determining a plurality of first target amounts of blowing to each of the computers on the basis of the second information, for determining a plurality of second target amount of blowing from each of the air transfer grilles on the basis of the plurality of first target amounts and the first information stored in the memory so that each of air of the first target amounts are blown to each of the computer, and for determining a plurality of open amounts of the plurality of each of the air transfer grilles on the basis of the plurality of second target amounts so that each of the amounts of blowing from each of the grilles becomes each of the second target amounts, a controller for controlling each of the open amount on the basis of the each of the determined open amounts.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 8 shows an exemplary target air volume of each grille 23.

FIGS. 9A and 9B show that a simulation are repeated at each change in the grille aperture ratio to cause the simulation air volume to approach the target grille volume.

FIG. 10 is a flowchart illustrating all of processing procedures performed through the open amount controlling apparatus according to the second embodiment.

DESCRIPTION OF EMBODIMENTS

Hereinafter, an open amount controlling apparatus, a grille aperture ratio-calculating method, and a grille aperture ratio-calculating program according to each embodiment will be described in detail with reference to the attached drawings.

First Embodiment

In each of the following embodiments, the configuration and processing of an open amount controlling apparatus 1 according to a first embodiment will be described and the advantages of the first embodiment will be described at the end.

Figure 1:
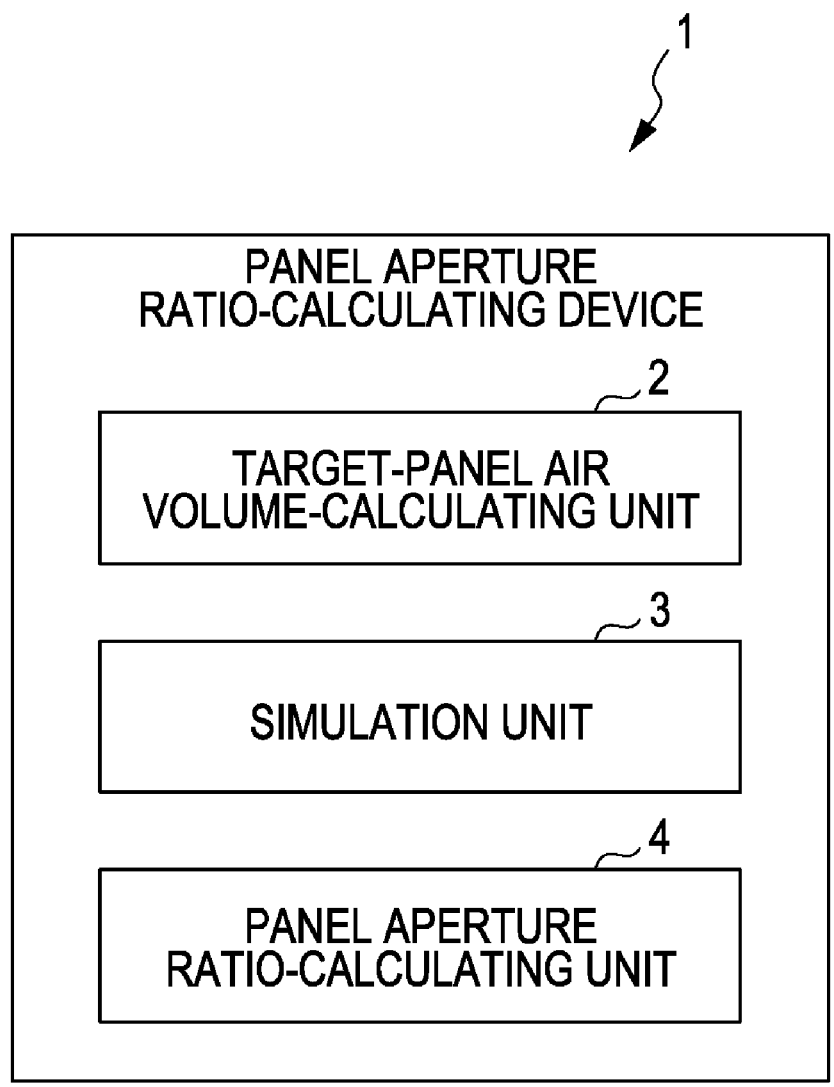
FIG. 1 is a block diagram showing the configuration of an open amount controlling apparatus according to a first embodiment.

First, the configuration of the open amount controlling apparatus 1 according to the first embodiment will be described with reference to a block diagram shown in FIG. 1.

The open amount controlling apparatus 1 according to the first embodiment calculates the aperture ratio of a grille provided to supply cooling air to cool racks 21. Particularly, the open amount controlling apparatus 1 includes a target-grille air volume-calculating unit 2, a simulation unit 3, and a grille aperture ratio-calculating unit 4.

The target-grille air volume-calculating unit 2 calculates information about the target grille air volume appropriate to cool the racks 21 regarding cooling air which is sent through a grille to cool the racks 21.

The simulation unit 3 sets a specified grille aperture ratio, performs a simulation based on the specified grille aperture ratio, and calculates the simulation-grille air volume information indicating the volume of air sent from the grille to the rack 21 as the simulation result.

The grille aperture ratio-calculating unit 4 calculates the target grille aperture ratio based on the difference between the target-grille air volume information calculated through the target-grille air volume-calculating unit 2 and the simulation-grille air volume information calculated through the simulation unit 3.

Thus, the grille aperture ratio-calculating unit 1 calculates the target-grille air volume information indicating the air volume which is appropriate to cool the racks 21 regarding the cooling air which is sent through the grille to cool the racks 21. Further, the open amount controlling apparatus 1 sets the specified grille aperture ratio, performs the simulation based on the specified grille aperture ratio information, and calculates the simulation-grille air volume information indicating the volume of air sent from the grille to the racks 21 as the simulation result. Then, the open amount controlling apparatus 1 calculates the target grille aperture ratio based on the difference between the target-grille air volume information and the simulation-grille air volume information. In an embodiment, the open amounts of the air transfer grilles is determined such that amounts of the intake air of the plurality of computers of each of the racks 21 become substantially congruent with amounts of air blowing from the air transfer grilles.

Therefore, the open amount controlling apparatus 1 calculates the appropriate grille aperture ratio and performs the layout optimization by adjusting the grille arrangement, the grille aperture ratio, etc. so that the cooling air is appropriately sent to the racks 21. Consequently, the racks 21 can be cooled with efficiency.

Second Embodiment

Hereinafter, the configuration and processing flow of an open amount controlling apparatus 10 according to a second embodiment will be described in sequence and the advantages of the second embodiment will be described at the end. Further, in the following second embodiment, the target grille volumes indicating the air volume which is appropriate to cool the racks 21 is calculated for each grille 23 in a data center having under floor space provided to supply cooling air from an air conditioner 22 to racks 21, for example.

[The Configuration of the Open Amount Controlling Apparatus]

Figure 2:
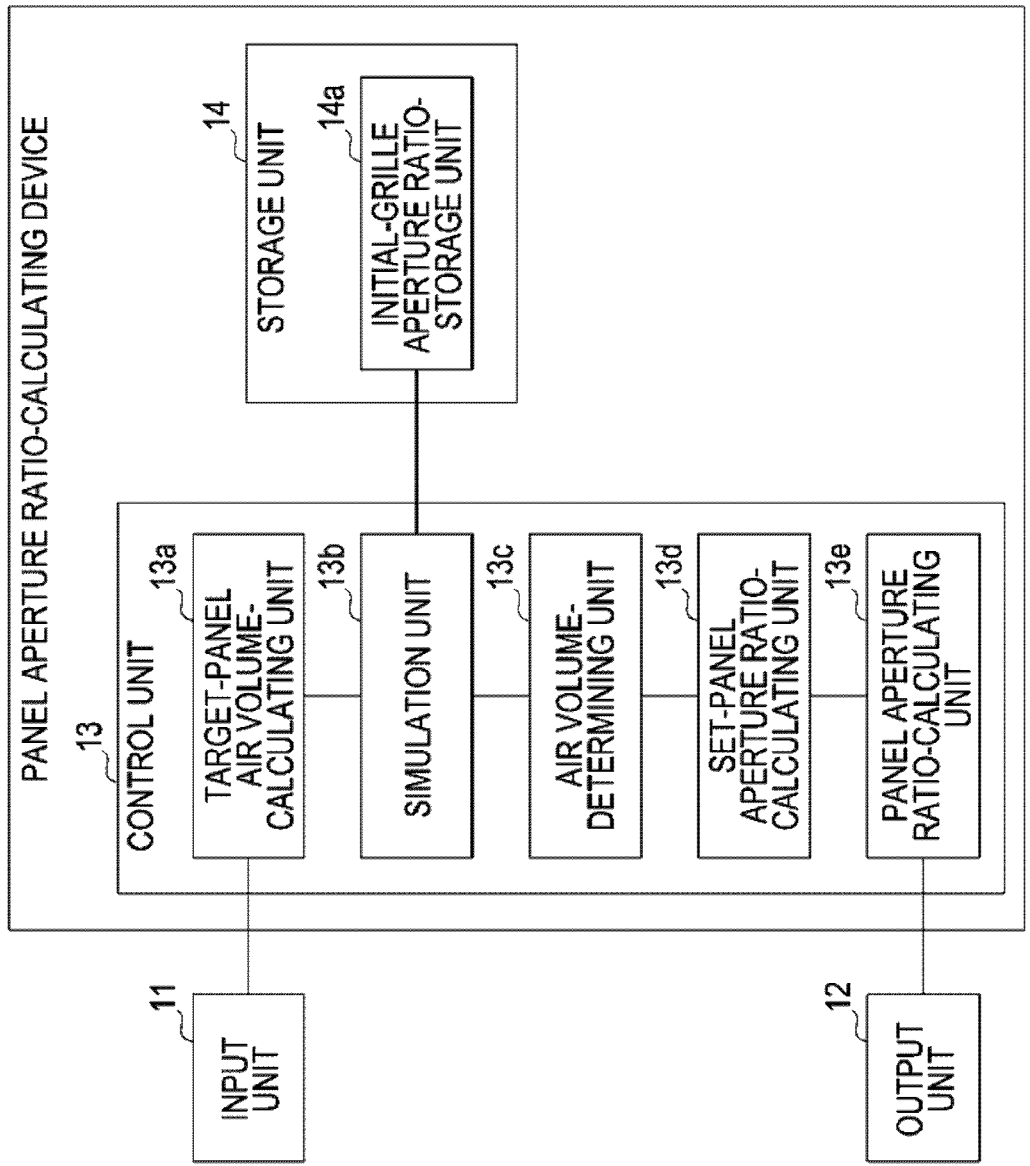
FIG. 2 is a block diagram showing the configuration of an open amount controlling apparatus according to a second embodiment.

First, the configuration of the open amount controlling apparatus 10 will be described with reference to a block diagram shown in FIG. 2. As shown in FIG. 2, the above-described open amount controlling apparatus 10 includes an input unit 11, an output unit 12, a control unit 13, and a storage unit 14. Hereinafter, the processing performed through each of the above-described units will be described.

The input unit 11 is provided to transmit the rack 21 arrangement information, the grille 23 arrangement information, information about the air volume of each rack 21, information about the calorific value of each rack 21, information about the gross air volume of the racks 21, information about the gross calorific value of the racks 21, information about the gross air volume of the air conditioners 22, etc, and includes a keyboard, a mouse, a microphone, and so forth. Further, the output unit 12 externally transmits information about the grille aperture ratio.

The storage unit 14 stores data and/or programs used to execute various types of processing through the control unit 13, and particularly includes an initial-grille aperture ratio-storage unit 14a configured to store information about a specified grille aperture ratio used to perform the first simulation as the initial value.

The control unit 13 includes an internal memory provided to store programs specifying various types of processing procedures and appropriate data. The control unit 13 performs various types of processing based on the above-described appropriate data and programs, and particularly includes a target-grille air volume-calculating unit 13a, a simulation unit 13b, an air volume-determining unit 13c, a set-grille aperture ratio-calculating unit 13d, and a grille aperture ratio-calculating unit 13e.

The target-grille air volume-calculating unit 13a calculates the target grille volume which is appropriate to cool the racks 21 regarding the cooling air which is sent through the grille 23 to cool the racks 21. More specifically, the input unit 11 transmits the rack 21 arrangement information, the grille 23 arrangement information, the air volume information of each rack 21, the calorific value information of each rack 21, the gross air volume information of the racks 21, the gross calorific value information of the racks 21 (and/or the gross air volume information of the air conditioners 22), etc. to the target-grille air volume-calculating unit 13a. Then, the target-grille air volume-calculating unit 13a calculates the target grille volume based on the transmitted information.

Here, processing performed to calculate the target grille volume will be specifically described with reference to FIGS. 3, 4, 5, 6, 7, and 8. First, the target-grille air volume-calculating unit 13a calculates the number of racks 21 to which each of the grilles 23 corresponds. For example, the target-grille air volume-calculating unit 13a determines the rack coordinates a[j, 1] indicating the coordinates of a rack 21, the grille coordinates b[i, 1] indicating the coordinates of a grille 23, and the rack volume x[i, 1] indicating the air volume of each of the racks 21.

Figure 3:
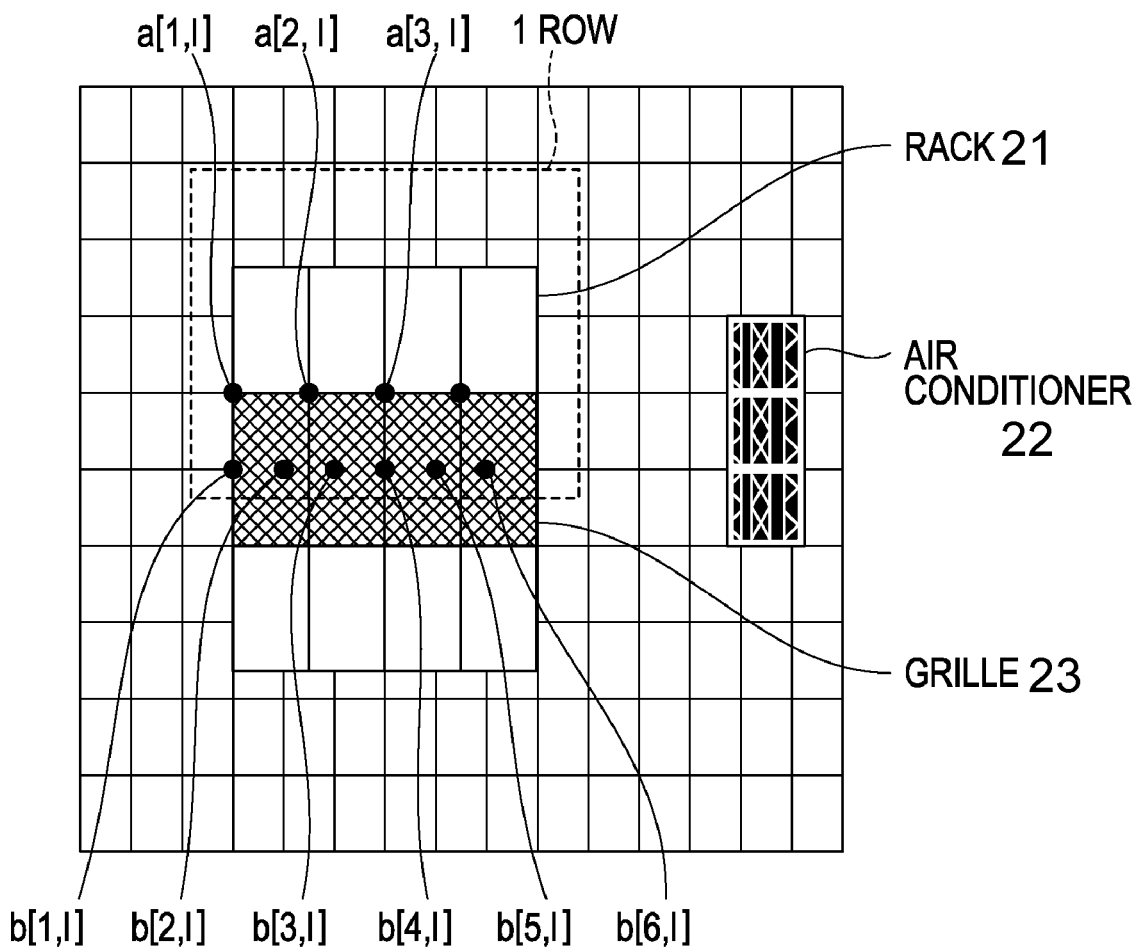
FIG. 3 shows an exemplary arrangement of racks 21 and grilles 23.

For example, in the case where an exemplary data center shown in FIG. 3 is used, the coordinates a[1, 1], a[2, 1], a[3, 1], etc. are set as the rack coordinates indicating the coordinates of a row of racks 21. Further, the coordinates b[1, 1], b[2, 1], b[3, 1] . . . , b[6, 1] are set as the grille coordinates indicating the coordinates of a row of grilles 23. FIG. 3 shows an exemplary arrangement of racks 21 and that of grilles 23. Here, FIG. 3 is a top view of a data center where cooling air sent from an air conditioner 22 flows from the under floor space and passes through the grilles 23 so that the cooling air is supplied to the racks 21. In an embodiment, storage unit 14 stores a layout relationship between grilles 23 and racks 21 at the opposed position.

Then, the target-grille air volume-calculating unit 13a calculates the number "k" of at least a single set of the rack coordinates a[j, 1] shown between the grille coordinates b[i, 1] and b[i+1, 1] that are determined in regard to the value "i" for each of the grilles 23.

Figure 4:
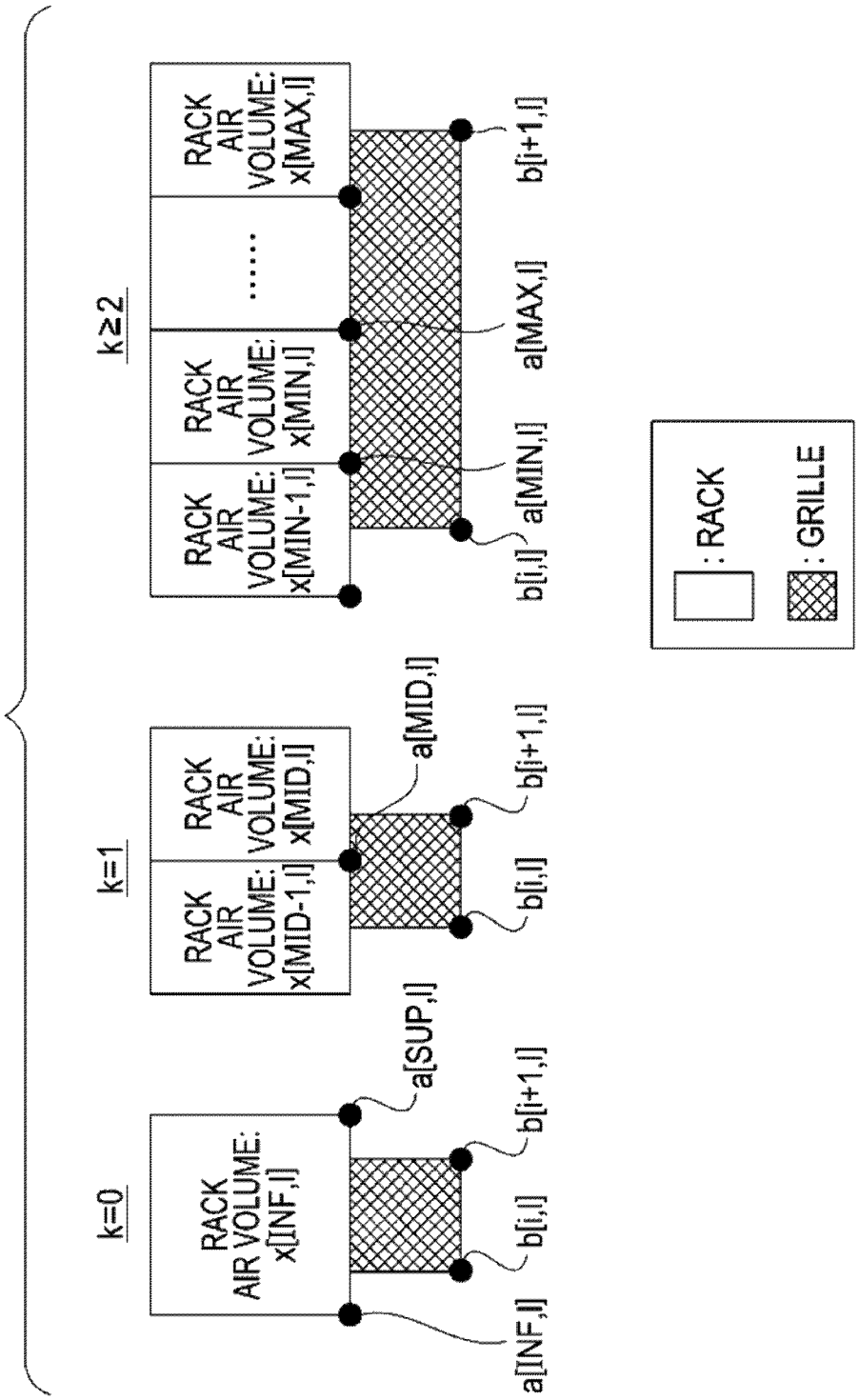
FIG. 4 shows the positional relationship of racks 21 and grilles 23.

Here, the positional relationship of the racks 21 and the grilles 23 will be described with reference to FIGS. 4, 5, and 6. When the equation "k"="0" holds, as shown in FIG. 4, there is not any set of the rack coordinates between the grille coordinates b[i, 1] and b[i+1, 1]. Further, when the equation "k"="1" holds, there is a single set of the rack coordinates between the grille coordinates b[i, 1] and b[i+1, 1].

Figure 5:
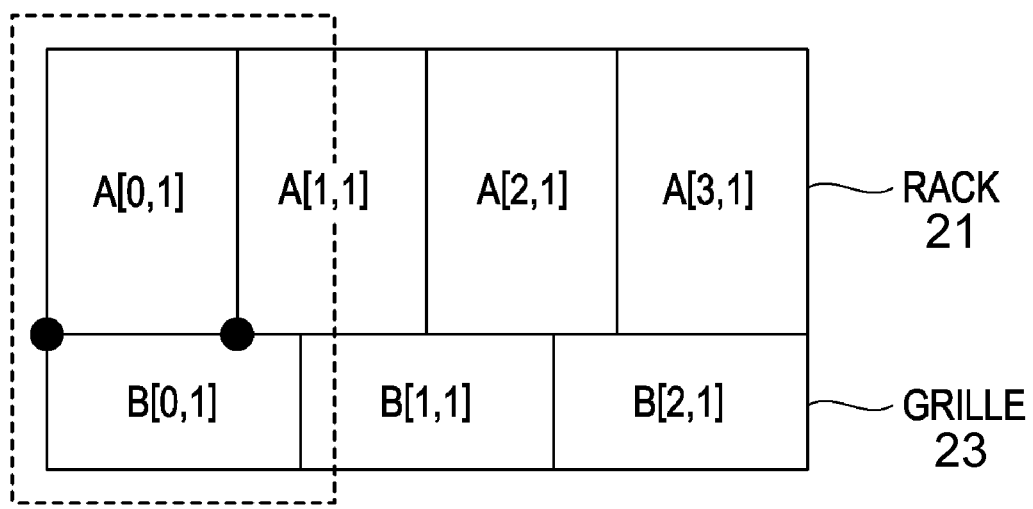
FIG. 5 also shows the positional relationship of racks 21 and grilles 23.

In an example shown in FIG. 5, there are at least two sets of the rack coordinates between the grille coordinates of both ends of a grille 23 B[0, 1] so that the inequality "k"≧"2" holds. Further, since there is a single set of the rack coordinates between the grille coordinates of both ends of a grille 23 B[1, 1], the equality "k"="1" holds. Further, there are at least two sets of the rack coordinates between the grille coordinates of both ends of a grille 23 B[2, 1] so that the inequality "k"≧"2" holds.

Figure 6:
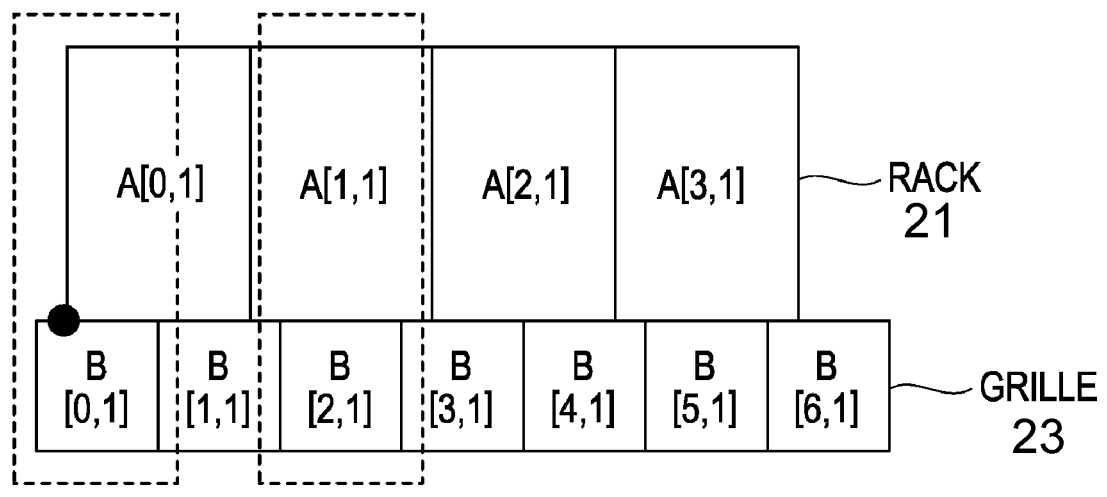
FIG. 6 also shows the positional relationship of racks 21 and grilles 23.

Likewise, in an example shown in FIG. 6, there is a single set of the rack coordinates between the grille coordinates of both ends of each of grilles 23 B[0, 1], B[1, 1], B[3, 1], B[4, 1], and B[6, 1] so that the equality "k"="1" holds. Further, since there is not any set of the rack coordinates between the grille coordinates of both ends of each of grilles 23 B[2, 1] and B[5, 1], the equality "k"="0" holds.

Here, the target-grille air volume-calculating unit 13a selects a calculation formula appropriate to calculate the target grille 23 based on the value of "k" and performs the target grille 23 calculation processing. For example, when the value of "k" is "0", the target-grille air volume-calculating unit 13a calculates the target grille volume y[j, 1] according to the following expression (1).

$$y[j,l]=\{(b[j+1,l]-b[j,l])/(a[\text{SUP}+1,l]-a[\text{INF},l])\}*(Tc/Tr)*x[i,l] \quad (1)$$

Namely, the target-grille air volume-calculating unit 13a calculates the target grille volume y[j, 1] based on the ratio between the grille 23 width observed between the grille coordinates (the grille coordinates b[i, 1] and b[i+1, 1] in FIG. 4) and the rack 21 width observed between the rack coordinates of both ends (the rack coordinates a[INF, 1] and a[SUP, 1] in FIG. 4). Here, the sign "Tc" indicates information about the gross air volume of the air conditioners 22 and the sign "Tr" indicates information about the gross air volume of the racks 21.

Figure 7:
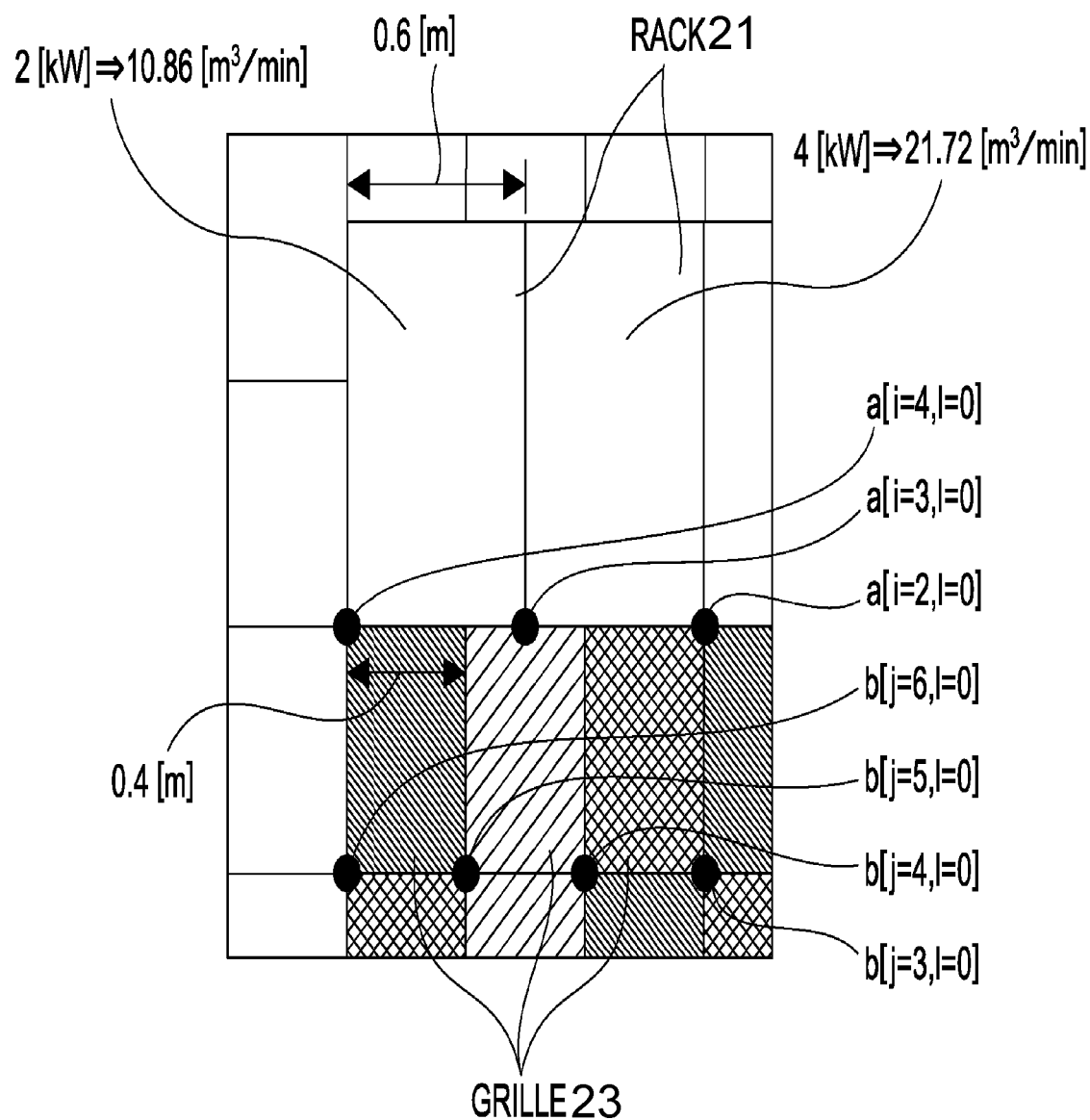
FIG. 7 shows the grille volume determined by exemplary calculation.

Here, the above-described configurations will be specifically described based on an example shown in FIG. 7. The method of calculating the target volume air of a grille 23 having the grille coordinates b[6, 0] and b[5, 0] of both ends, where the value of "k" is "0", will be described. FIG. 7 is provided to illustrate the grille volume determined by exemplary calculation. As shown in FIG. 7, the target-grille air volume-calculating unit 13a calculates the ratio between the rack 21 width "0.6 m" shown between the rack coordinates a[4, 0] and a[3, 0] and the grille 23 width "0.4 m" shown between the grille coordinates b[6, 0] and b[5, 0].

Further, the ratio between the gross rack—air volume "130.32 m³/min" and the gross air conditioner—air volume "200 m m³/min" is calculated. The values of the above-described ratios are multiplied by the rack volume "10.86 m³/min" so that the target grille volume "10.60 m³/min" is calculated.

Further, when the value of "k" is "1", the target-grille air volume-calculating unit 13a calculates the target grille volume y[j, 1] according to the following expression (2). Here, the target-grille air volume-calculating unit 13a searches for the rack coordinates matching the condition of the rack coordinates shown between the grille coordinates of both ends, which is shown as "b[i, 1]<a[t, 1]<b[i+1, 1]". When the value of "k" is "1", the constant t has a single value and the equation MID=t holds $$y[j,l]=\{(a[\text{MID},l]-b[j,l])/(a[\text{MID},l]-a[\text{MID}-1,l])\}*(Tc/Tr)*x[\text{MID}-1,l]+\{(a[\text{MID},l]-b[j+1,l])/(a[\text{MID}+1,l]-a[\text{MID},l])\}*(Tc/Tr)*x[\text{MID},l] \quad (2)$$

Namely, the target-grille air volume-calculating unit 13a calculates the ratio between the rack 21 width and the grille 23 width for each of the two racks 21 corresponding to the rack coordinates (the rack coordinates a[MID, 1] in FIG. 4) shown between the grille coordinates of both ends (the grille coordinates b[i, 1] and b[i+1, 1] in FIG. 4), and calculates the target grille volume y[j, 1] based on the sum total of the ratios.

Here, the above-described configurations will be specifically described based on the example shown in FIG. 7. The method of calculating the target air volume of a grille 23 having the grille coordinates b[4, 0] and b[5, 0] of both ends, where the value of "k" is "1", will be described. As shown in FIG. 7, the target-grille air volume-calculating unit 13a calculates the ratio between the rack 21 width and the grille 23 width for each of the two racks 21 corresponding to the rack coordinates a[3, 0] shown between the grille coordinates b[4, 0] and b[5, 0] of both ends. The ratios are shown as "0.2 m/0.6 m" and "0.2/0.6 m", respectively.

Then, the target-grille air volume-calculating unit 13a multiplies the ratio "0.2 m/0.6 m" by the ratio between the gross rack volume 130.32 m³/min and the gross air conditioner—air volume 200 m³/min, and the rack volume "10.86 m3/min". Further, the target-grille air volume-calculating unit 13a multiplies the ratio "0.2 m/0.6 m" by the ratio between the gross rack volume "130.32 m3/min" and the gross air conditioner—air volume 200 m3/min, and the rack volume "21.72 m3/min". Then, the target-grille air volume-calculating unit 13a sums the values obtained through the multiplications to calculate the target grille volume "16.39 m3/min".

Further, when the value of "k" is "2" or more, the target-grille air volume-calculating unit 13a calculates the target grille volume y[j, l] according to the following expression (3). Here, the target-grille air volume-calculating unit 13*a* searches for the rack coordinates matching the condition of the rack coordinates shown between the grille coordinates of both ends, which is shown as "b[i, l]<a[t, l]<b[i+1, l]". When the value of "k" is "2" or more, the constant t has two values. In that case, the maximum value of the constant t is indicated by the sign "MAX" and the minimum value of the constant t is indicated by the sign "MIN".

$$y[j,l]=\{\{|a[MIN,l]-b[j,l]|/(a[MIN,l]-a[MIN-1,l])\}*x[MIN-1,l]+\ldots x[MIN,l]+\ldots +x[MAX-1,l]+\ldots +\{|a[MAX,l]-b[j+1,l]|/(a[MAX+1,l]-a[MAX,l])\}*x[MAX,l]\}*(Tc/Tr) \quad (3)$$

Namely, according to the example shown in FIG. 4, the target-grille air volume-calculating unit 13*a* determines the minimum rack coordinates a[MIN, l] and the maximum rack coordinates a[MAX, l] that are shown between the grille coordinates b[i, l] and b[i+1, l] of both ends. Then, the target-grille air volume-calculating unit 13*a* multiplies the ratio between the rack 21 width corresponding to the minimum rack coordinates a[MIN, l] and the coordinates a[MIN−1, l] adjacent thereto, and a width observed between the grille coordinates b[i, l] and the rack coordinates a[MIN, l] by the rack volume x[MIN−1, l].

Then, the target-grille air volume-calculating unit 13*a* multiplies the ratio between the rack 21 width corresponding to the maximum rack coordinates a[MAX, l] and the coordinates a[MAX+1, l] adjacent thereto, and a width observed between the grille coordinates b[i+1, l] and the rack coordinates a[MAX, l] by the rack volume x[MAX, l]. Then, the target-grille air volume-calculating unit 13*a* sums the two values obtained through the multiplications and the rack volume x[MAX, l]~ the rack volume x[MAX−1, l]. Then, the target-grille air volume-calculating unit 13*a* multiplies the result of the above-described sum by Tc/Tr to calculate the target grille volume y[j, l].

Thus, as shown in FIG. 8, the target-grille air volume-calculating unit 13*a* calculates and sets the target grille volume for each of the grilles 23. FIG. 8 shows an exemplary target air volume of each of the grilles 23. Further, FIG. 8 is a top view of a data center where cooling air sent from an air conditioner 22 flows from the under floor space and passes through the grilles 23 so that the cooling air is supplied to the racks 21.

The simulation unit 13*b* sets a specified grille aperture ratio, performs a simulation based on the specified grille aperture ratio information, and calculates the simulation air volume indicating the volume of air sent from the grille 23 to the racks 21, as a result of the simulation. Further, the simulation unit 13*b* performs the simulation again based on the grille aperture ratio calculated through the set-grille aperture ratio-calculating unit 13*d* that will be described later, and calculates the simulation air volume indicating the volume of air passing through the grille 23, as a result of the simulation.

More specifically, the simulation unit 13*b* sets the grille aperture ratio, where data of the above-described grille aperture ratio is stored in the initial-grille aperture ratio-storage unit 14*a*, as the initial value, performs a simulation, and calculates the grille volume as the simulation result. Then, the simulation unit 13*b* calculates the pressure loss ΔP based on the grille volume obtained as the simulation result according to the following expression (4).

$$\Delta P[j,l]=\{r*K(O[j,l])*(y[j,l]/(S*O[j,l]))^2\}/2 \quad (4)$$

Here, the sign "O[j, l]" denotes the grille aperture ratio obtained when the air volume y[j, l] is attained through the grille 23 B[j, l]. The sign "r" denotes the air density, the sign "S" denotes the grille 23 area, and the sign K(O) denotes a resistance coefficient determined based on the grille aperture ratio O. When a perforated plate is used, the resistance coefficient is calculated according to the following expression (5).

$$K(x)=(1x^2)*\{0.707*(1-x)^0.375+1-x\}^2 \quad (5)$$

Upon receiving information about the grille aperture ratio O used to perform the next simulation, the information being transmitted from the set-grille aperture ratio-calculating unit 13*d*, the simulation unit 13*b* performs the simulation again based on the transmitted grille aperture ratio information.

The air volume-determining unit 13*c* determines whether or not the value of the difference between the target grille volume and the calculated simulation air volume is greater than or equal to a specified threshold value. More specifically, the air volume-determining unit 13*c* compares the target grille volume calculated through the target-grille air volume-calculating unit 13*a* and the simulation air volume calculated through the simulation unit 13*b*, and determines whether or not the value of the difference between the simulation air volume and the target grille volume is greater than or equal to the specified threshold value.

For example, as processing performed to determine whether or not the value of the difference between the simulation air volume and the target grille volume is greater than or equal to the specified threshold value, the air volume-determining unit 13*c* calculates the average of differences between the target grille volume and the simulation air volume according to the following expression (6), and determines whether or not the calculated value is greater than or equal to the specified threshold value.

$$\Sigma j,l<|y[j,l]-y[j,l]|/\{(y[j,l]+y[j,l])/2\}>/\{(n-1)*(L-1)\} \quad (6)$$

When the result of the above-described determination shows that the value of the difference between the target grille volume and the simulation air volume is greater than or equal to the specified threshold value, the air volume-determining unit 13*c* notifies the set-grille aperture ratio-calculating unit 13*d* that the simulation shall be performed again. Further, when the result of the above-described determination shows that the value of the difference between the target grille volume and the simulation air volume is smaller than the threshold value, the air volume-determining unit 13*c* notifies the grille aperture ratio-calculating unit 13*e* that the grille aperture ratio information shall be calculated.

When it is determined that the value of the difference between the target grille volume and the simulation air volume is greater than or equal to the specified threshold value, the set-grille aperture ratio-calculating unit 13*d* calculates the grille aperture ratio information set for the next simulation based on the target-grille volume information and the simulation air volume information. Namely, upon receiving the notification that the simulation shall be performed again, the notification being transmitted from the air volume-determining unit 13*c*, the set-grille aperture ratio-calculating unit 13*d* calculates the grille aperture ratio O used to perform the next simulation according to the following expression (7), and notifies the simulation unit 13*b* of the calculation result. More specifically, the set-grille aperture ratio-calculating unit 13*d* substitutes the grille aperture ratio information set through the simulation, the simulation air volume information indicating the simulation result, and the target grille air volume into the expression (7) to calculate the grille aperture ratio information set for the next simulation. Here, the sign "O[j, l]" denotes the grille aperture ratio obtained when the air volume y[j, l] is attained through the grille 23 B[j, l], and the air volume y~[j, l] indicates the target grille volume, and the sign "O~[j, l]" indicates the grille aperture ratio set for the next simulation.

$$\{r^*K(O[j,l])^*(y[j,l]/(S^*O[j,l]))^{\hat{}}2\}/2 = \{r^*K(O[j,l])^*(y[j,l]/(S^*O[j,l]))^{\hat{}}2\}/2 \quad (7)$$

Namely, the set-grille aperture ratio-calculating unit 13d calculates the grille aperture ratio appropriate to achieve the target grille volume according to a calculation formula including the variables corresponding to the simulation air volume, the target grille volume, and the current grille aperture ratio.

Figure 9A:
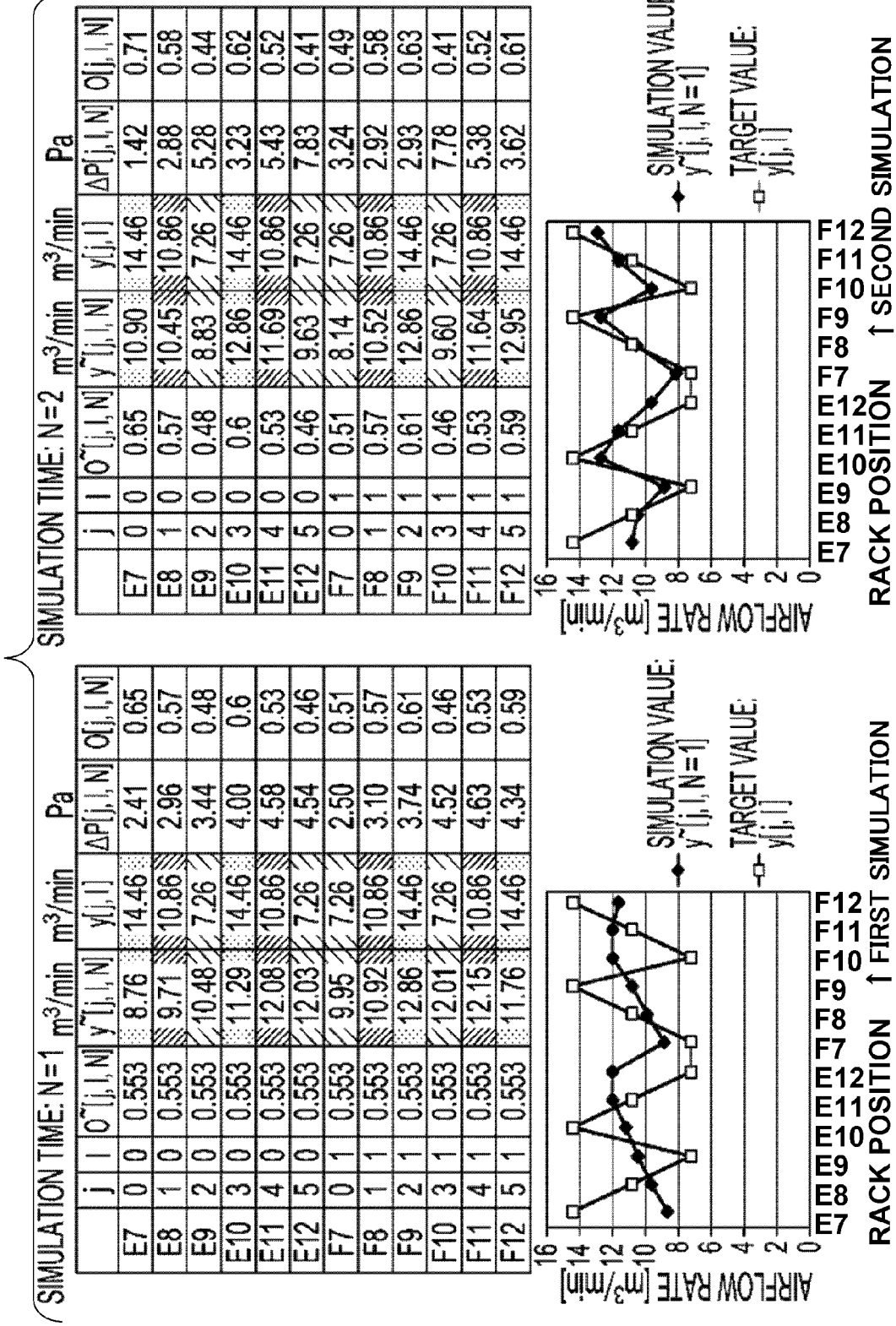

Here, according to processing described in FIGS. 9A and 9B, a simulation is repeated to cause the simulation air volume to approach the target grille volume. Namely, FIGS. 9A and 9B show that the grille aperture ratio is changed and the simulation is repeated to cause the simulation air volume to approach the target grille volume. As shown in FIGS. 9A and 9B, the simulation unit 13b sets the initial value of the grille aperture ratio (the grille aperture ratio stands at 55.3% in FIG. 9), where the data of the initial value is stored in the initial-grille aperture ratio-storage unit 14a, and performs the first simulation.

Then, the simulation unit 13b calculates the simulation air volume (shown as the simulation value in FIGS. 9A and 9B) as the simulation result. For example, the simulation unit 13b determines the simulation air volume of a grille 23 E7 to be "8.76 m3/min" by calculation.

Next, the set-grille aperture ratio-calculating unit 13d substitutes the simulation air volume, the target grille volume, and the current grille aperture ratio into the above-described expression (7) to calculate the grille aperture ratio used to perform the next simulation. For example, the set-grille aperture ratio-calculating unit 13d determines the grille aperture ratio used to perform the next simulation of the grille 23 E7 to be "0.65" by calculation.

The grille aperture ratio-calculating unit 13e calculates the target grille aperture ratio based on the difference between the target-grille volume information and the simulation-air volume information. More specifically, upon receiving an instruction to calculate the grille aperture ratio information, the instruction being transmitted from the air volume-determining unit 13c, the grille aperture ratio-calculating unit 13e externally transmits the grille aperture ratio information set for the simulation as the target aperture ratio information.

After that, the simulation unit 13b optimizes the grille aperture ratio by repeating the simulation to cause the simulation air volume to approach the target grille volume. As indicated by the graphs shown in the lower part of FIG. 9, the simulation air volume approaches the target grille volume as the simulation is repeated.

Then, when the value of the difference between the target grille volume and the simulation air volume becomes smaller than the threshold value during the fourth simulation, the grille aperture ratio-calculating unit 13e externally transmits data of the grille aperture ratio used for the fourth simulation as data of the target aperture ratio. For example, the grille aperture ratio-calculating unit 13e externally transmits data shown as "0.74" as the target aperture ratio of the grille 23 E7.

[Processing Performed Through the Open Amount Controlling Apparatus]

Figure 11:
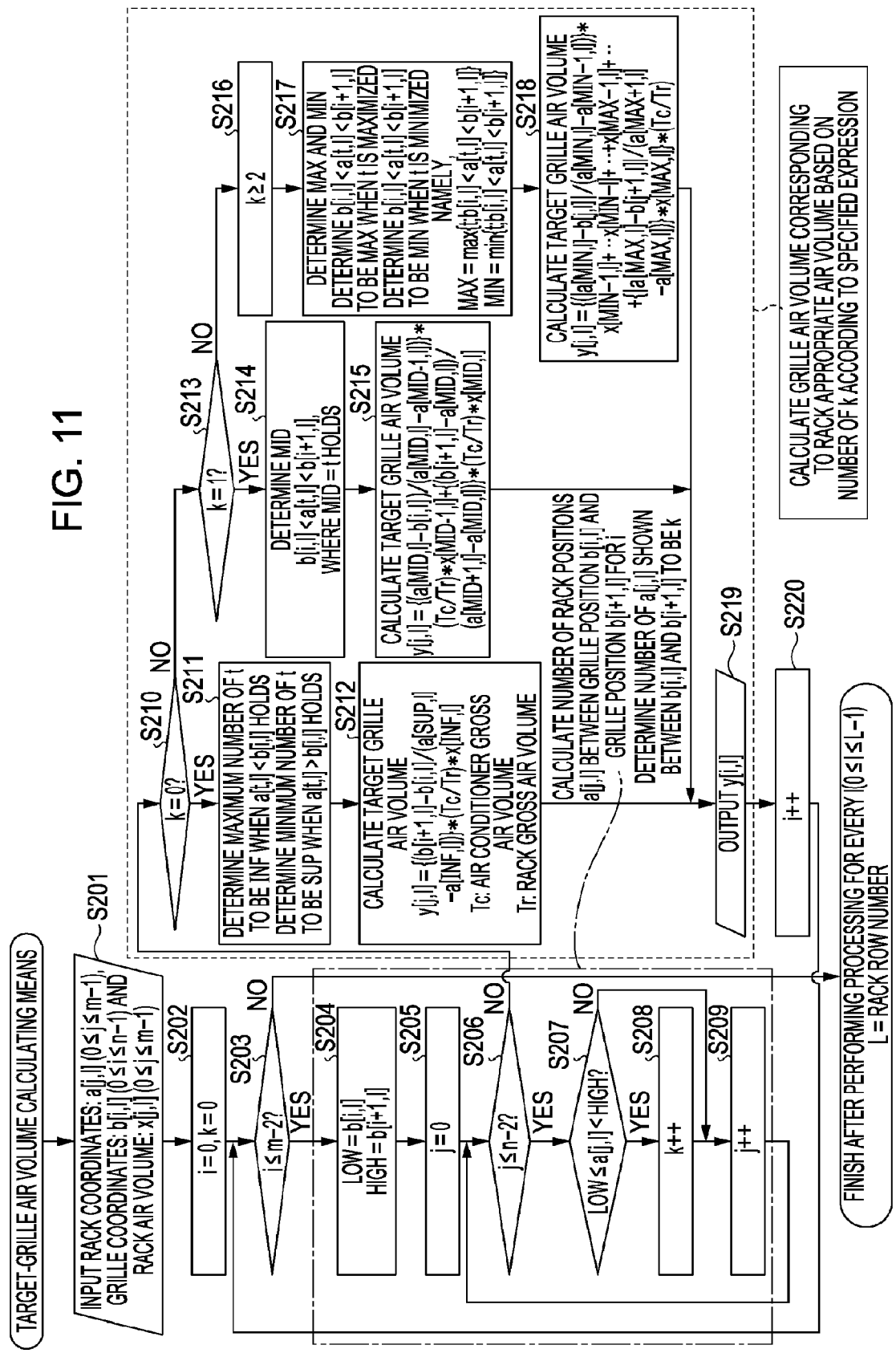
FIG. 11 is a flowchart illustrating target grille-calculating processing procedures performed through the open amount controlling apparatus according to the second embodiment.
Figure 12:
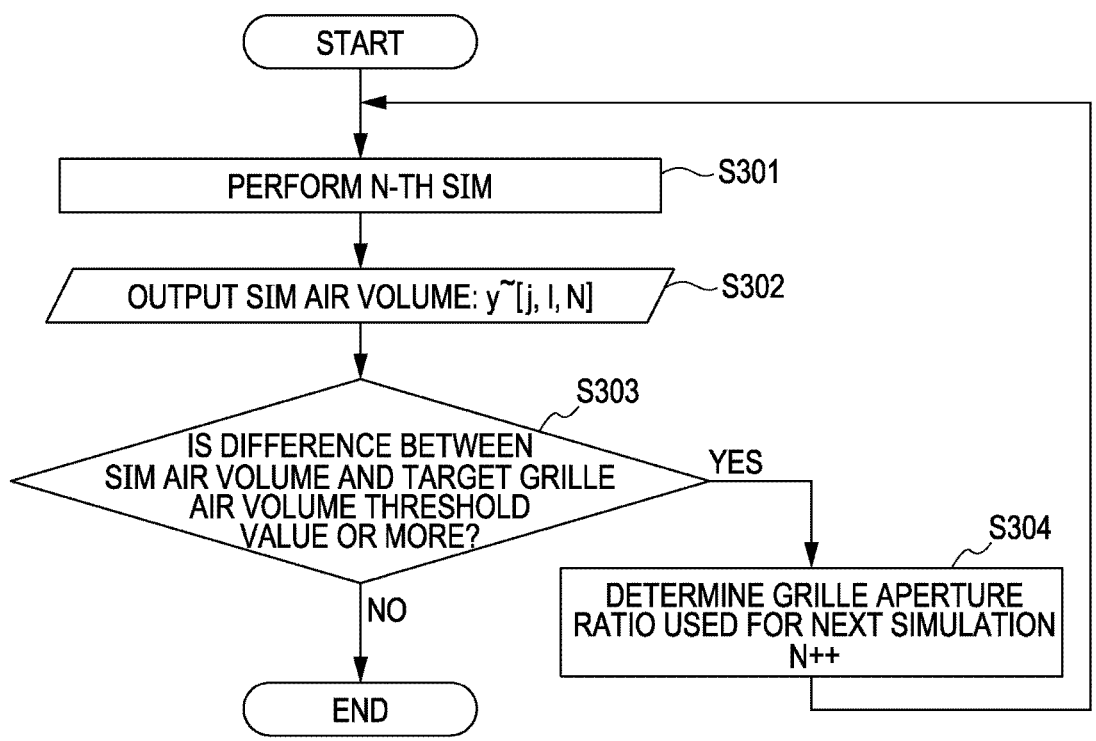
FIG. 12 is a flowchart illustrating target-grille volume-achievement-determination processing performed through the open amount controlling apparatus according to the second embodiment.

Next, processing performed through the open amount controlling apparatus 10 according to the first embodiment will be described with reference to FIGS. 10, 11, and 12. FIG. 10 is a flowchart illustrating all of processing procedures performed through the open amount controlling apparatus according to the second embodiment. FIG. 11 is a flowchart illustrating the target grille-calculating processing procedures performed through the open amount controlling apparatus according to the second embodiment. FIG. 12 is a flowchart illustrating the target-grille volume-achievement-determination processing procedures performed through the open amount controlling apparatus according to the second embodiment.

As shown in FIG. 10, the open amount controlling apparatus 10 transmits information about, for example, the heat quantity of a rack 21 (operation S101) and calculates the target grille volume indicating the air volume appropriate to cool the racks 21 regarding cooling air sent through the grille 23 to cool the racks 21 (operation S102), which will be described later with reference to FIG. 11.

Then, the open amount controlling apparatus 10 sets the grille aperture ratio, where data of the grille aperture ratio is stored in the initial grille aperture ratio-storage unit 14a, as the initial value (operation S103), and performs a simulation (operation S104). Then, the open amount controlling apparatus 10 performs the target-grille volume-achievement-determination processing (operation S105) to determine whether or not the value of the difference between the simulation air volume obtained as the simulation result and the target grille volume is greater than or equal to the specified threshold value, which will be described later with reference FIG. 12, and determines whether or not the simulation processing may be finished (operation S106).

When it is determined, as a consequence, that the value of the difference between the simulation air volume and the target grille volume is smaller than the specified threshold value and the simulation processing may be continued (No at operation S106), the open amount controlling apparatus 10 calculates the grille aperture ratio appropriate to achieve the target grille volume according to a calculation formula including the simulation air volume, the target grille volume, and the current grille aperture ratio as variables (operation S107). Then, the open amount controlling apparatus 10 performs the simulation again based on the calculated grille aperture ratio (operation S104).

Further, when it is determined that the value of the difference between the simulation air volume obtained as the simulation result and the target grille volume is greater than or equal to the specified threshold value and the simulation processing may be finished (Yes at operation S106), the open amount controlling apparatus 10 externally transmits the grille aperture ratio information used to perform the simulation as the target-aperture ratio information (operation S108).

Then, the target grille-calculation processing performed through the open amount controlling apparatus 10 will be described with reference to FIG. 11. As shown in FIG. 11, the target-grille air volume-calculating unit 13a of the open amount controlling apparatus 10 transmits information about the rack coordinates, the grille coordinates, and the rack volume (operation S201) and determines that the equations i=0 and k=0 hold, as the initialization processing (operation S202).

Then, the target-grille air volume-calculating unit 13a determines whether or not the value "i" is smaller than or equal to the value "m−2" obtained by subtracting "2" from the total number of racks 21, which is indicated by the sign "m" (operation S203). Namely, when the value "i" is greater than the value "m−2" (No at operation S203), the target-grille air volume-calculating unit 13a determines that the number "k" is calculated for each of the grilles 23 and terminates the processing.

Further, when the value "i" is smaller than the value "m−2", the target-grille air volume-calculating unit 13a determines that the equations LOW=b[i, l] and HIGH=b[i+1, l] hold (operation S204), and determines that the equation j=0 holds (operation S205). Then, the target-grille air volume-calculating unit 13a determines whether or not the value "j" is smaller than or equal to the value "n−2" obtained by subtracting "2" from the total number of grilles 23, which is indicated by the sign "n" (operation S206).

When the result of the above-described determination shows that the value "j" is smaller than or equal to the value "n−2" (Yes at operation S206), the target-grille air volume-calculating unit 13a determines whether or not the inequality LOW≤a[j, l]≤HIGH holds (operation S207). Namely, the target-grille air volume-calculating unit 13a determines whether or not the rack coordinates a[j, l] fall within the range of the equation LOW=b[i, l] to the equation HIGH=b[i+1, l].

When the result of the above-described determination shows that the inequality LOW≤a[j, l]≤HIGH holds (Yes at operation S207), the target-grille air volume-calculating unit 13a adds the value of the number "k" (operation S208), adds the value "j" (operation S209), and repeats the processing performed to determine whether or not the inequality LOW≤a[j, l]≤HIGH holds (from operation S206 to operation S209).

Further, when the value "j" exceeds the value "n−2" (No at operation S206), the target-grille air volume-calculating unit 13a determines that the number "k" of the racks 21 corresponding to a single grille 23 is calculated and performs the target grille-calculation processing.

The target-grille air volume-calculating unit 13a determines whether or not the equation "k"="0" holds (operation S210). When it is determined that the equation "k"="0" holds (Yes at operation S210), the target-grille air volume-calculating unit 13a sets the maximum number INF for the constant t where the inequality a[t, l]<b[i, l] holds and the minimum number SUP for the constant t where the inequality a[t, l]<b[i, l] holds (operation S211). Then, the target-grille air volume-calculating unit 13a calculates the target grille volume y[j, l] corresponding to the ratio between the grille 23 width observed between the grille coordinates and the rack 21 width observed between the rack coordinates of both ends according to the above-described expression (1) (operation S212).

When it is determined that the equation "k"="0" does not hold (No at operation S210), the target-grille air volume-calculating unit 13a determines whether or not the equation "k"="1" holds (operation S213). Then, the target-grille air volume-calculating unit 13a searches for the rack coordinates a[t, l] matching the condition of the rack coordinates shown between the grille coordinates of both ends, which is shown as "b[i, l]<a[t, l]<b[i+1, l]", and sets the value of the constant t as MID (operation S214). After that, the target-grille air volume-calculating unit 13a calculates the target grille volume y[j, l] according to the above-described expression (2) (operation S215).

Further, when it s determined that the equation "k"="1" does not hold (No at operation S213), the target-grille air volume-calculating unit 13a determines that the inequality "k"≥"2" holds (operation S216). Then, the target-grille air volume-calculating unit 13a determines the maximum value of the constant t to be MAX and the minimum value of the constant t to be MIN (operation S217). After that, the target-grille air volume-calculating unit 13a calculates the target grille volume y[j, l] according to the above-described expression (3) (operation S218).

After that, the target-grille air volume-calculating unit 13a externally transmits data of the target grille volume y[j, l] (operation S219), adds the value "i", and returns to operation S203. Here, when the value "i" exceeds the value "m−2" (No at operation S203), the target-grille air volume-calculating unit 13a determines that the number "k" is calculated for each of the grilles 23 and terminates the processing. The above-described operations are performed for each row l (where the inequality 0≤l≤L−1 holds). Here, the sign "L" denotes the total number of rack 21 rows.

Next, the target-grille volume-achievement determination processing will be described with reference to FIG. 12. As shown in FIG. 12, the simulation unit 13b of the open amount controlling apparatus 10 performs the N-th simulation (operation S301), and externally transmits information about the simulation air volume as the simulation result, where the simulation air volume indicates the volume of air sent from the grille 23 to the racks 21 (operation S302).

Then, the air volume-determining unit 13c compares the target grille air volume with the simulation air volume and determines whether or not the value of the difference between the simulation air volume and the target grille volume is greater than or equal to the specified threshold value (operation S303).

When the result of the above-described determination shows that the value of the difference between the target grille volume and the simulation grille air volume is greater than or equal to the specified threshold value (Yes at operation S303), the simulation unit 13b sets the grille aperture ratio used to perform the next simulation, increments the value N by "1" (operation S304), and returns to operation S301. Further, when it is determined that the value of the difference between the target grille volume and the simulation grille air volume is smaller than the specified threshold value, the target-grille volume-achievement determination processing is terminated.

Advantages of First Embodiment

As described above, the open amount controlling apparatus 10 calculates the target-grille air volume information indicating the air volume appropriate to cool the rack 21 regarding cooling air which is sent through the grille to cool the racks 21. Further, the open amount controlling apparatus 10 determines a specified grille aperture ratio, performs a simulation based on the specified grille aperture ratio, and calculates the simulation-grille air volume information indicating the volume of air sent from the grille to the racks 21 as the simulation result. Then, the open amount controlling apparatus 10 calculates the target grille aperture ratio based on the difference between the target-grille air volume information and the simulation-grille air volume information.

Therefore, the open amount controlling apparatus 10 calculates the appropriate grille aperture ratios and performs the layout optimization by adjusting the grille 23 arrangement, the grille aperture ratios, etc. so that the cooling air is appropriately distributed among the racks 21. Consequently, the racks 21 can be cooled with efficiency.

Figure 13:
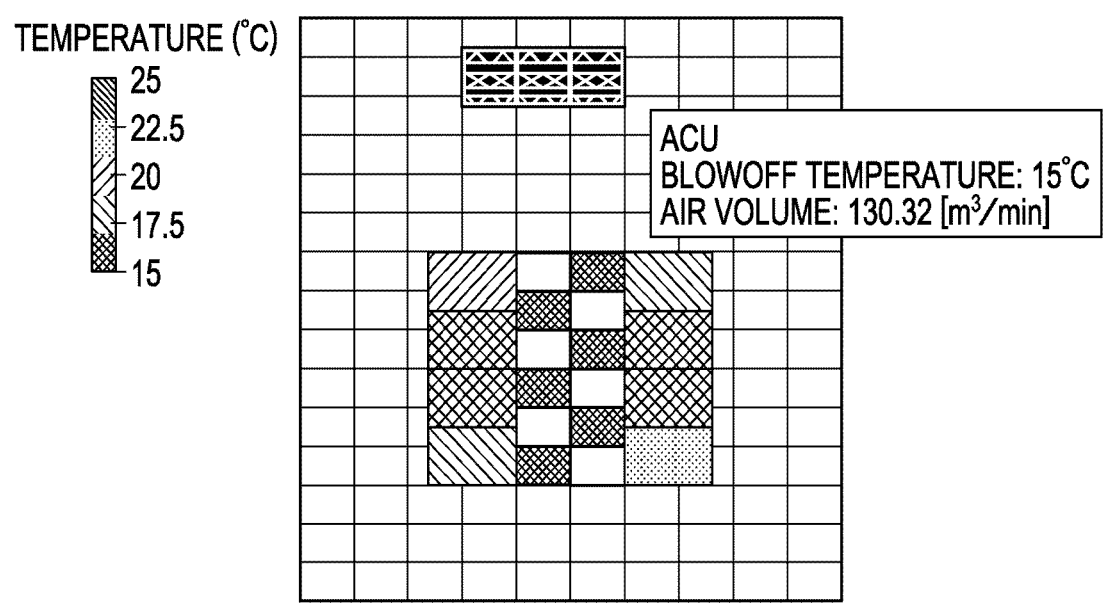
FIG. 13 shows the rack 21 temperature obtained when the grille aperture ratios is not improved.
Figure 14:
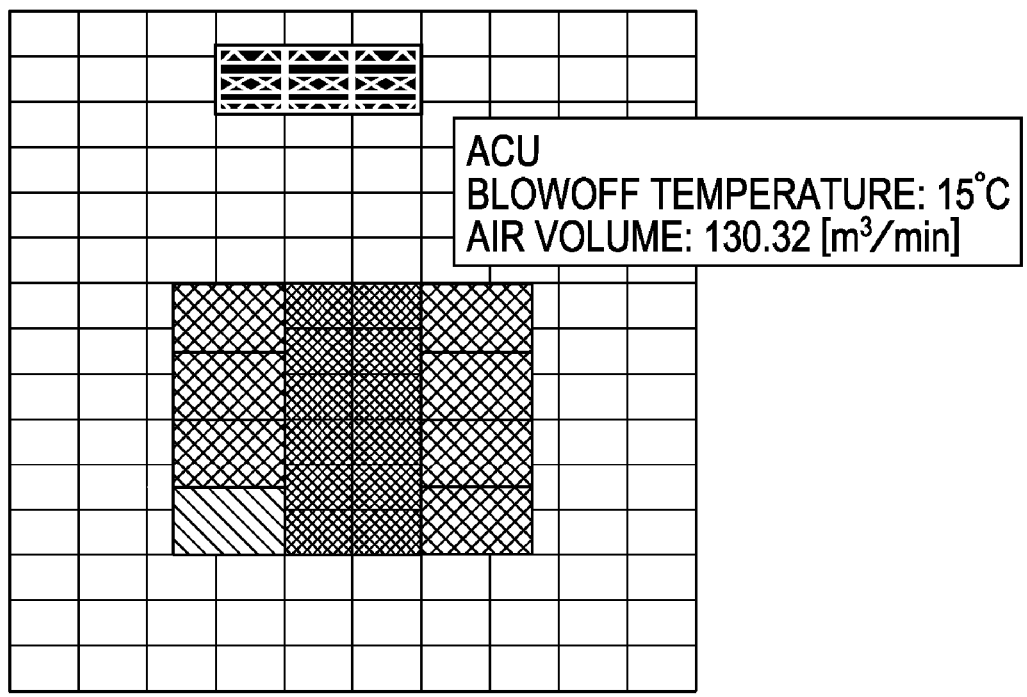
FIG. 14 shows the rack 21 temperature obtained when the grille aperture ratios is improved.
Figure 15:
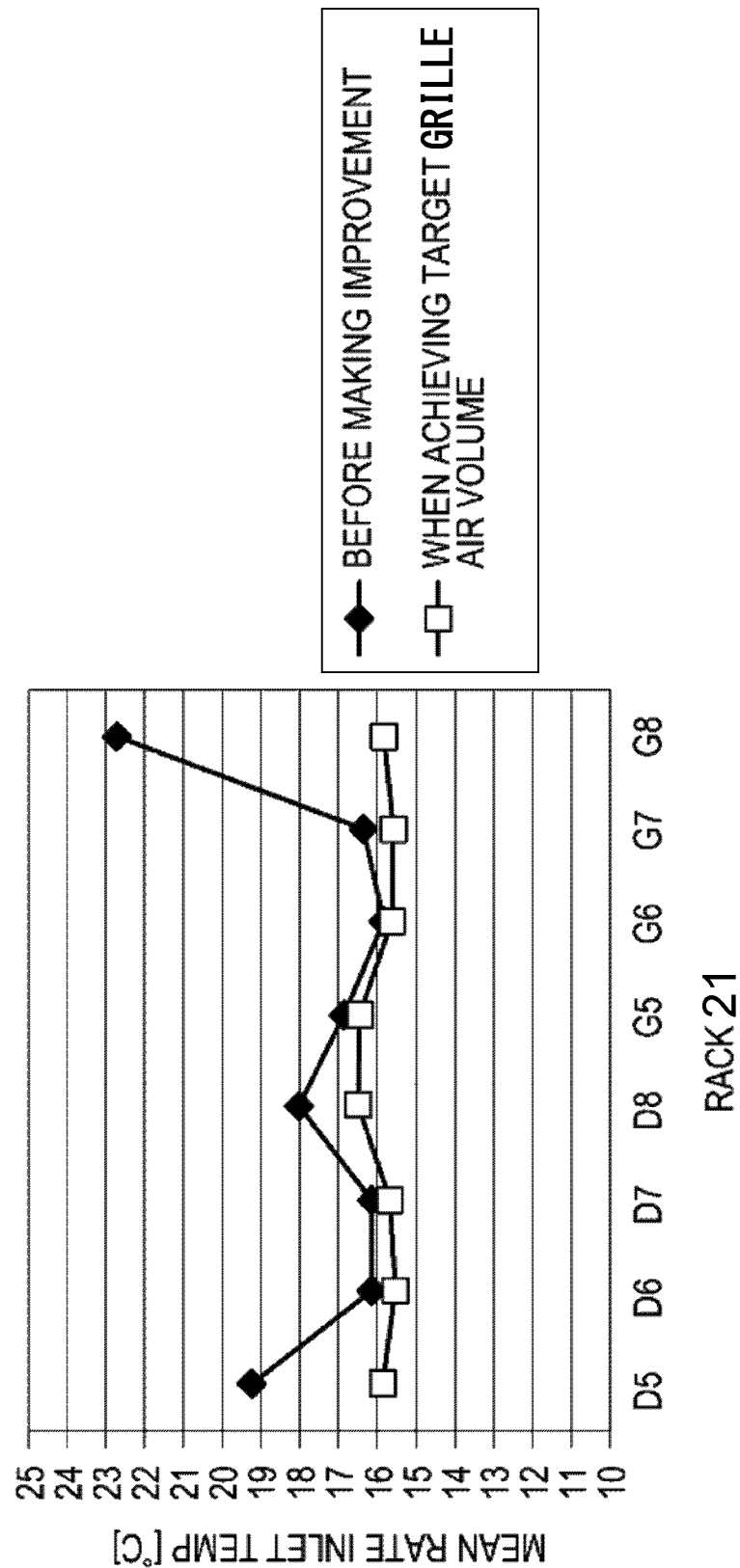
FIG. 15 shows a comparison of the rack 21 intake air temperature obtained when the grille aperture ratio is improved and that obtained when the grille aperture ratio is not improved.

Here, the rack 21 temperature obtained through the layout optimization including the adjustment of the grille 23 arrangement, the grille aperture ratios, and so forth will be described with reference to FIGS. 13 and 14. FIG. 13 shows the rack 21 temperatures obtained in an air conditioning system where the grille aperture ratios is not improved, and FIG. 14 shows the rack 21 temperatures obtained in an air conditioning system where the grille aperture ratios is improved. The blow off temperature and the air volume of the air conditioning system exemplarily shown in FIG. 13 are the same as those of the air conditioning system exemplarily shown in FIG. 14. However, the temperature of the rack s shown in FIG. 14 is lower than that of the rack s shown in FIG. 13. Namely, the racks shown in FIG. 14 are cooled with efficiency. More specifically, as exemplarily shown in FIG. 15, the rack 21 temperature obtained at the time when the target grille volumes is achieved is lower than that obtained before the above-described improvement, which means that the racks 21 are cooled with efficiency.

Further, according to the first embodiment, the open amount controlling apparatus 10 determines whether or not the value of the difference between the target-grille air volume information and the simulation-grille air volume information is greater than or equal to the specified threshold value. When it is determined that the value of the difference between the target-grille air volume information and the simulation-grille air volume information is greater than or equal to the specified threshold value, the open amount controlling apparatus 10 calculates the grille aperture ratio information set for the next simulation based on the target-grille air volume information and the simulation-grille air volume information. After that, the open amount controlling apparatus 10 performs the simulation again based on the calculated grille aperture ratio and calculates the simulation-grille air volume information indicating the volume of air sent from the grille to the racks 21 as the simulation result. When it is determined that the value of the difference between the calculated target-grille air volume information and the simulation-grille air volume information is smaller than the specified threshold value, the set grille aperture ratio information is determined to be the target aperture ratio information by calculation.

Therefore, the open amount controlling apparatus 10 repeats the simulation until the simulation grille air volume approaches the target grille air volume to calculate a more appropriate grille aperture ratio. Consequently, the layout optimization including the adjustment of the grille 23 arrangements, the grille aperture ratios, and so forth is attained so that cooling air is appropriately distributed among the racks 21. As a result, the racks 21 are cooled with efficiency.

Further, according to the first embodiment, the open amount controlling apparatus 10 calculates the target grille air volume based on the rack 21 arrangement information, the grille arrangement information, information about the air volume of each of the racks 21, information about the calorific value of each of the racks 21, information about the gross air volume of the racks 21, information about the gross calorific value of the racks 21 (and/or information about the gross air volume of the air conditioners 22), etc., so that the appropriate target grille air volume can be calculated.

Further, according to the first embodiment, the open amount controlling apparatus 10 calculates the target grille volume based on the ratio between the rack 21 width and the grille 23 width so that the appropriate target grille air volume can be calculated based on the rack 21 arrangement, the racks 21*ize*, the grille 23 arrangement, and the grilles 23*ize*.

(1) Conditions for Terminating Simulation Processing

In the above-described second embodiment, the target grille air volume and the simulation air volume are compared with each other, and the simulation processing is terminated when the value of the difference between the simulation air volume and the target grille volumes is smaller than or equal to the specified threshold value. However, the third embodiment is achieved without being limited to the second embodiment.

For example, the open amount controlling apparatus 10 may terminate the simulation processing when the value of the difference between the pressure loss calculated based on the grille volume obtained as the simulation result and the pressure loss calculated based on the grille volume obtained as the previous simulation result.

Further, the open amount controlling apparatus 10 may terminate the simulation processing when the value of the difference between the grille aperture ratios used to perform the simulation and that used to perform the previous simulation is smaller than or equal to the specified threshold value.

Thus, when it is determined that the value of the difference between the pressure loss calculated based on the target-grille air volume information and that calculated based on the simulation-grille air volume information is greater than or equal to the specified threshold value, the open amount controlling apparatus 10 calculates the grille aperture ratio information set for the next simulation based on the target-grille air volume information and the simulation-grille air volume information. Therefore, the simulation is repeated until the appropriate pressure loss is obtained so that a more appropriate grille aperture ratio can be determined by calculation.

Thus, when the value of the difference between the grille aperture ratio used to perform the simulation and that used to perform the previous simulation is smaller than or equal to the specified threshold value, the open amount controlling apparatus 10 calculates the grille aperture ratio information set for the next simulation based on the target-grille air volume information and the simulation-grille air volume information. Therefore, the simulation is repeated until a change in the grille aperture ratio becomes insignificant so that a more appropriate grille aperture ratio can be determined by calculation.

(2) Target Grille Volume-Calculations

Further, the target grille volumes may be calculated in consideration of the grille 23 position and/or the rack 21 position. For example, since the exhaust infiltration often occurs in the racks 21 provided at the four corners of the rack 21 row, the target grille volume may be increased for the above-described racks 21.

Thus, the target grille volumes is calculated in consideration of the grille 23 position and/or the rack 21 position, which makes it possible to calculate the appropriate target grille volume.

(3) System Configuration, Etc.

The components of each of the devices are functionally and conceptually illustrated in the attached drawings, and may not be configured as physically as shown in the drawings. Namely, the specific form of distribution and/or integration of the devices is not limited to those shown in the drawings, and all or part of the devices may be distributed and/or integrated functionally and/or physically in an arbitrary unit based on various loads and/or service conditions. For example, the target-grille air volume-calculating unit 13*a* and the simulation unit 13*b* may be integrated. Further, all or arbitrary part of the processing functions performed in the devices may be achieved through a CPU and/or a program which is analyzed and executed through the CPU, or may be achieved as hardware attained based on wired logic.

Further, of the processing procedures clarified in the above-described embodiment, all or part of the automatically performed processing procedures may be manually performed. Otherwise, all or part of the manually performed processing procedures may be automatically performed according to a known method. Further, the processing procedures, the control procedures, the specific names, and the information including various data and/or parameters that are shown in the above-described embodiments and/or the attached drawings may be arbitrarily changed apart from specified cases.

(4) Programs

Incidentally, the various processing procedures clarified in the above-described embodiments may be achieved through a computer executing a predetermined program. Hereinafter, therefore, an exemplary computer executing a program having the same functions as those of the above-described embodiments will be described with reference to FIG. 16. More specifically, FIG. 16 shows a computer executing a grille aperture ratio-calculating program.

Figure 16:
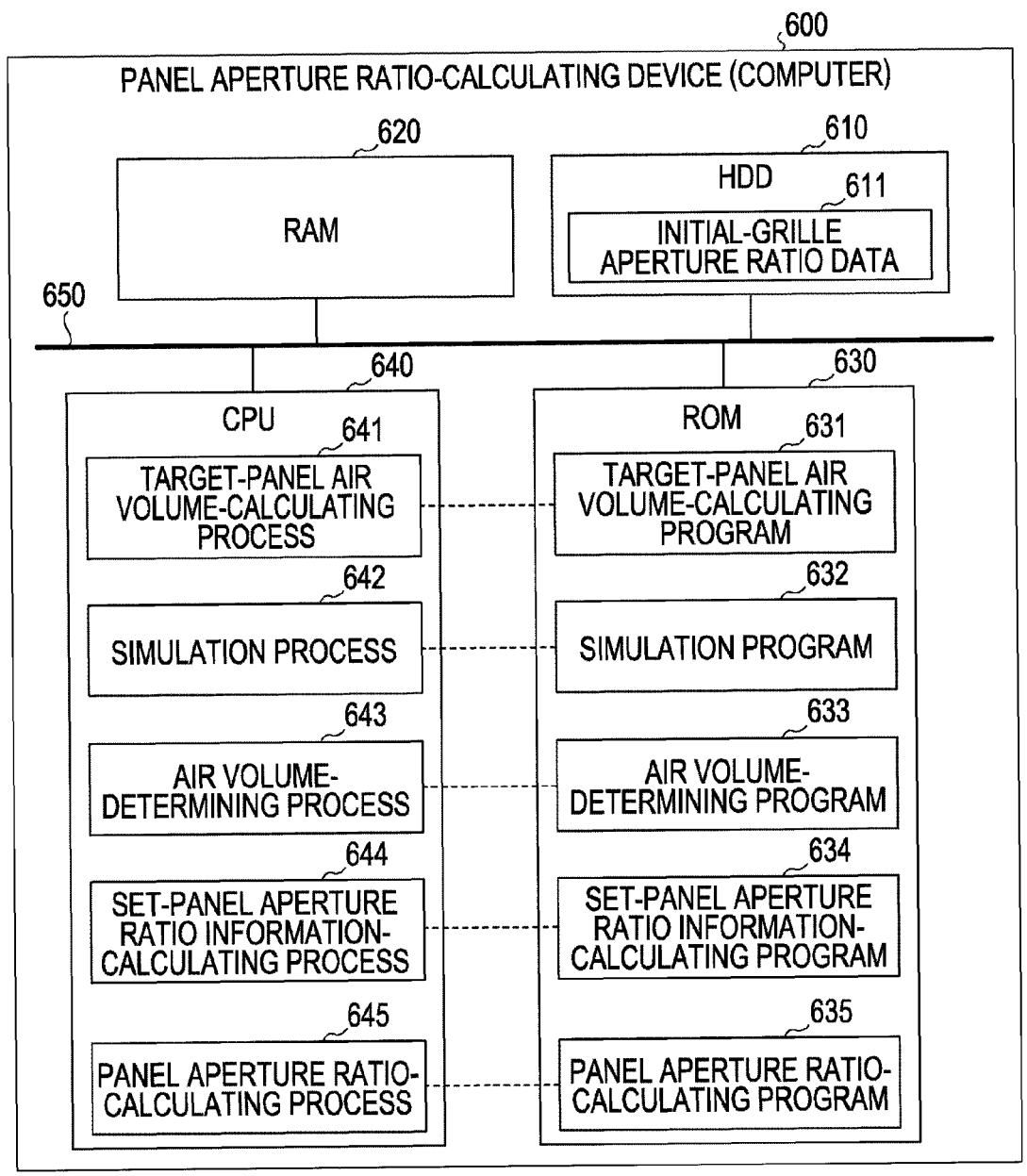
FIG. 16 shows a computer executing a grille aperture ratio-calculating program.
Figure 17:
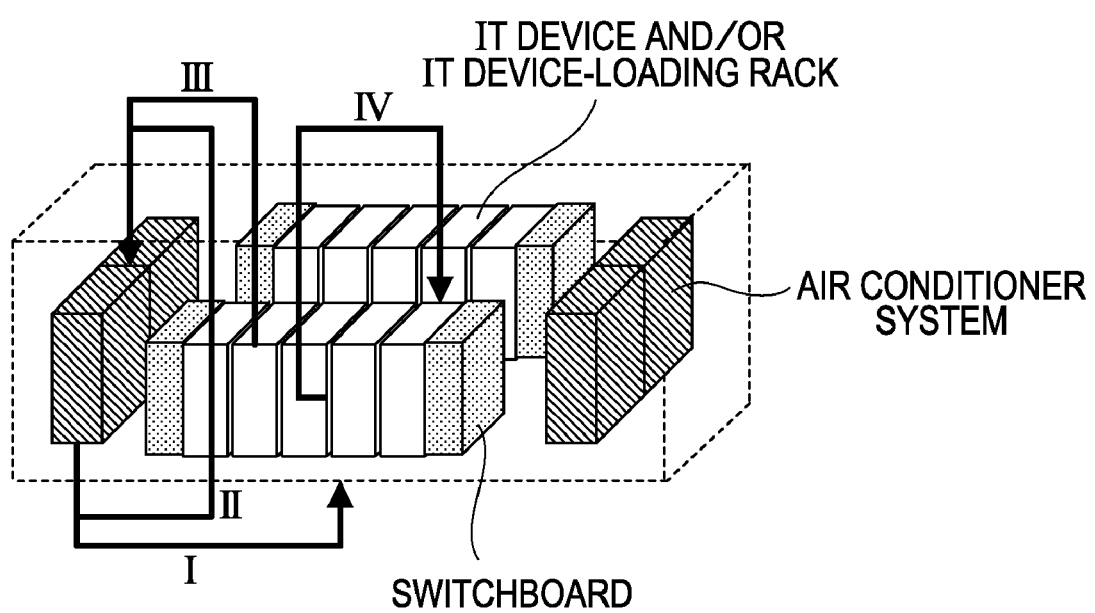
FIG. 17 shows the air flow observed in an air conditioning system.

As shown in FIG. 16, a computer 600 provided as the open amount controlling apparatus includes an HDD 610, a RAM 620, a ROM 630, and a CPU 640 that are connected to one another via a bus 650.

The ROM 630 stores a grille aperture ratio-calculating program having the same functions as those of the above-described embodiments. Namely, as shown in FIG. 16, a target-grille air volume-calculating program 631, a simulation program 632, an air volume-determining program 633, a set grille aperture ratio-calculating program 634, and a grille aperture ratio-calculating program 635 are stored in the ROM 630 in advance. Here, the programs 631, 632, 633, 634, and 635 may be integrated and/or distributed as appropriate as is the case with the components of the open amount controlling apparatus 10 shown in FIG. 2.

Further, when the CPU 640 executes the above-described programs 631 to 635 that are read from the ROM 630, the programs 631 to 635 function as a target-grille air volume-calculating process 641, a simulation process 642, an air volume-determining process 643, a set-grille aperture ratio-calculating process 644, and a grille aperture ratio-calculating process 645, as shown in FIG. 16. The processes 641 to 645 correspond to the respective target-grille air volume-calculating unit 13a, simulation unit 13b, air volume-determining unit 13c, set-grille aperture ratio-calculating unit 13d, and grille aperture ratio-calculating unit 13e that are shown in FIG. 2.

Further, initial-grille aperture ratio data 611 is stored in the HDD 610 as shown in FIG. 16. The initial-grille aperture ratio data 611 corresponds to the initial-grille aperture ratio storage unit 14a shown in FIG. 2.

In the embodiments that described above, the aperture rate is calculated. However it may calculate another open amount (for example, opening space for each of the air transfer grilles).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An apparatus for controlling grille aperture ratios of a plurality of air transfer grilles which are installed in a room, each of the air transfer grilles blowing air cooled by an air conditioner, the room accommodating a plurality of racks, each of the racks installed with a plurality of computers, each of the computers having an inlet and controlling an amount of intake air on the basis of an internal temperature of each of the computers, the apparatus comprising:
   a memory for storing first information including a layout relationship between the air transfer grilles and the racks;
   a determining unit configured to:
      determine a plurality of target grille air volumes of air blowing to the racks,
      determine a plurality of simulation air volumes of air blowing from the air transfer grilles on the basis of the plurality of target grille air volumes of air and the first information stored in the memory so that each of the target grille air volumes of air is blown to each of the racks, and
      determine a plurality of grille aperture ratios of the air transfer grilles on the basis of the plurality of simulation air volumes of air so that each of the amounts of air blowing from the air transfer grilles becomes equal to each of the simulation air volumes second target; and
   a controller for controlling each of the grille aperture ratios of the air transfer grilles on the basis of each of the determined grille aperture ratios of the air transfer grilles.

2. The apparatus according to claim 1, wherein
the memory further stores second information representing amounts of intake air of the plurality of computers, and
the determining unit determines the plurality of target grille air volumes of air blowing to the racks on the basis of the internal temperatures of the computers and the second information stored in the memory.

3. The apparatus according to claim 1, wherein the determining unit determines the grille aperture ratios of the air transfer grilles so that amounts of the intake air of the plurality of computers of each of the racks become substantially in alignment with amounts of air blowing from the air transfer grilles on the basis of matching rack coordinates with grille coordinates.

4. The apparatus according to claim 1, wherein the determining unit determines the grille aperture ratios of the air transfer grilles by executing a simulation process.

5. The apparatus according to claim 1, wherein
the air intakes of the computers are arranged on the same side,
the plurality of racks are arranged in a line,
the plurality of air transfer grilles are arranged parallel to the line of the racks, and
a width of a line direction of each of the racks is different from a widths of a line direction of each of the air transfer grilles, and
the layout relationship in the first information stored in the memory is a relationship between the air transfer grilles and the racks at the opposed position.

6. A method for controlling grille aperture ratios of a plurality of air transfer grilles which are installed in a room, each of the air transfer grilles blowing air cooled by an air conditioner, the room accommodating a plurality of racks, each of the racks installed with a plurality of computers, each of the computers having an inlet and controlling an amount of intake air on the basis of an internal temperature of each of the computers, the method comprising:
   determining a plurality of target grille air volumes of air blowing to the racks;
   determining a plurality of simulation air volumes of air blowing from the air transfer grilles on the basis of the plurality of target grille air volumes and first information stored in a memory so that each of the target grille air volumes of air is blown to each of the racks, the first information including a layout relationship between the air transfer grilles and the racks;
   determining a plurality of grille aperture ratios of the air transfer grilles on the basis of the plurality of simulation air volumes so that each of the amounts of air blowing from each of the air transfer grilles becomes equal to each of the simulation air volumes; and controlling each of grille aperture ratios of the air transfer grilles on the basis of each of the determined grille aperture ratios of the air transfer grilles.

7. The method according to claim 6, wherein the memory further stores second information representing amounts of intake air of the plurality of the computers, and the determining determines the plurality of target grille air volumes of air blowing to the racks on the basis of the internal temperatures of the computers and the second information stored in the memory.

8. The method according to claim 6, wherein the determining determines the grille aperture ratios of each air transfer grille so that amounts of the intake air of the plurality of computers of each of the racks become substantially in alignment with amounts of air blowing from the air transfer grilles on the basis of matching rack coordinates with grille coordinates.

9. The method according to claim 6, wherein the determining determines the grille aperture ratios of each air transfer grille by executing a simulation process.

10. The apparatus according to claim 6, wherein the air intakes of the computers are arranged on the same side, the plurality of racks are arranged in a line, the plurality of air transfer grilles are arranged parallel to the line of the racks, a width of a line direction of each of the racks is different from a widths of a line direction of each of the air transfer grilles, and the layout relationship in the first information stored in the memory is a relationship between the air transfer grilles and the racks at the opposed position.

11. A non-transitory computer-readable recording medium storing a computer program for controlling grille aperture ratios of a plurality of air transfer grilles which are installed in a room, each of the air transfer grilles blowing air cooled by an air conditioner, the room accommodating a plurality of racks, each of the racks installed with a plurality of computers, each of the computers having an inlet and controlling an amount of intake air on the basis of an internal temperature of each of the computers, the computer program being designed to make a processor perform the steps of:

determining a plurality of target grille air volumes of air blowing to the racks;

determining a plurality of simulation air volumes of air blowing from the air transfer grilles on the basis of the plurality of target grille air volumes and first information stored in a memory so that each of the target grille air volumes of air is blown to each of the racks, the first information including a layout relationship between the air transfer grilles and the racks;

determining a plurality of grille aperture ratios of the air transfer grilles on the basis of the plurality of simulation air volumes so that each of the amounts of air blowing from each of the air transfer grilles becomes equal to each of the simulation air volumes; and controlling each of grille aperture ratios of the air transfer grilles on the basis of each of the determined grille aperture ratios of the air transfer grilles.

12. The non-transitory computer-readable recording medium according to claim 11, wherein the memory further stores second information representing the amounts of intake air of the plurality of the computers corresponding to the internal temperatures of the computers, and the determining determines the plurality of target grille air volumes of air blowing to the racks on the basis of the internal temperatures of the computers and the second information stored in the memory.

13. The non-transitory computer-readable recording medium according to claim 11, wherein the determining determines the grille aperture ratios of the air transfer grilles so that amounts of the intake air of the plurality of computers of each of the racks become substantially in alignment with amounts of air blowing from the air transfer grilles on the basis of matching rack coordinates with grille coordinates.

14. The non-transitory computer-readable recording medium according to claim 11, wherein the determining determines the grille aperture ratios of the air transfer grilles by executing a simulation process.

15. The non-transitory computer-readable recording medium according to claim 11, wherein the air intakes of the computers are arranged on the same side, the plurality of racks are arranged in a line, the plurality of air grilles are arranged parallel to the line of the racks, a width of a line direction of each of the racks is different from a widths of a line direction of each of the air transfer grilles, and the layout relationship in the first information stored in the memory is a relationship between the air transfer grilles and the racks at the opposed position.

* * * * *